United States Patent
Ashitani et al.

(10) Patent No.: US 11,477,406 B2
(45) Date of Patent: Oct. 18, 2022

(54) IMAGING DEVICE AND ELECTRONIC APPARATUS FOR EFFECTIVE PIXEL SIGNAL READING

(71) Applicant: SONY SEMICONDUCTOR SOLUTIONS CORPORATION, Kanagawa (JP)

(72) Inventors: Tatsuji Ashitani, Kanagawa (JP); Yukiyasu Tatsuzawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 157 days.

(21) Appl. No.: 16/961,049

(22) PCT Filed: Dec. 18, 2018

(86) PCT No.: PCT/JP2018/046585
§ 371 (c)(1),
(2) Date: Jul. 9, 2020

(87) PCT Pub. No.: WO2019/146316
PCT Pub. Date: Aug. 1, 2019

(65) Prior Publication Data
US 2021/0067726 A1 Mar. 4, 2021

(30) Foreign Application Priority Data
Jan. 24, 2018 (JP) .............................. JP2018-009367

(51) Int. Cl.
*H04N 5/3745* (2011.01)
*H01L 27/146* (2006.01)
(Continued)

(52) U.S. Cl.
CPC ... *H04N 5/37457* (2013.01); *H01L 27/14603* (2013.01); *H01L 27/14612* (2013.01);
(Continued)

(58) Field of Classification Search
CPC .... H04N 5/37457; H04N 5/347; H04N 5/341; H04N 5/345; H04N 5/3452;
(Continued)

(56) References Cited

U.S. PATENT DOCUMENTS

| | | | |
|---|---|---|---|
| 2014/0016006 A1* | 1/2014 | Tashiro | H04N 9/04557 348/301 |
| 2016/0373668 A1 | 12/2016 | Komai et al. | |
| 2018/0249099 A1* | 8/2018 | Kobayashi | H04N 5/3745 |

FOREIGN PATENT DOCUMENTS

| | | | |
|---|---|---|---|
| JP | 2009-296451 A | 12/2009 | |
| JP | 2015-100004 A | 5/2015 | |

(Continued)

OTHER PUBLICATIONS

International Search Report and Written Opinion of PCT Application No. PCT/JP2018/046585, dated Mar. 25, 2019, 08 pages of ISRWO.

*Primary Examiner* — Albert H Cutler
(74) *Attorney, Agent, or Firm* — Chip Law Group

(57) ABSTRACT

An imaging device according to the present disclosure includes a plurality of pixel units each including a first pixel unit and a second pixel unit and a vertical signal line, in which each of the first pixel unit and the second pixel unit includes an amplification transistor, a selection transistor connected between the amplification transistor and the vertical signal line, and a connection unit that selectively connects between a common connection node of the amplification transistor and the selection transistor of the first pixel unit and a common connection node of the amplification transistor and the selection transistor of the second pixel unit.

10 Claims, 22 Drawing Sheets

(51) Int. Cl.
*H04N 5/347* (2011.01)
*H04N 5/341* (2011.01)

(52) U.S. Cl.
CPC .. *H01L 27/14636* (2013.01); *H01L 27/14641* (2013.01); *H01L 27/14643* (2013.01); *H04N 5/347* (2013.01)

(58) Field of Classification Search
CPC ............... H04N 5/3454; H04N 5/3456; H01L 27/14603; H01L 27/14612; H01L 27/14636; H01L 27/14641; H01L 27/14643
See application file for complete search history.

(56) References Cited

FOREIGN PATENT DOCUMENTS

| | | |
|---|---|---|
| JP | 2015-144340 A | 8/2015 |
| JP | 2017-059875 A | 3/2017 |
| JP | 2018-009367 A | 1/2018 |

\* cited by examiner

TO COLUMN PROCESSING UNIT

TO COLUMN PROCESSING UNIT

TO COLUMN PROCESSING UNIT

FIG. 15
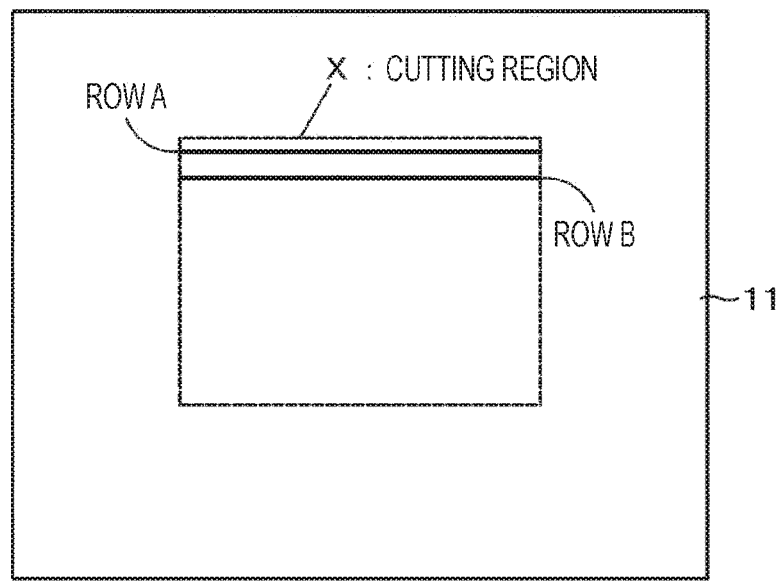
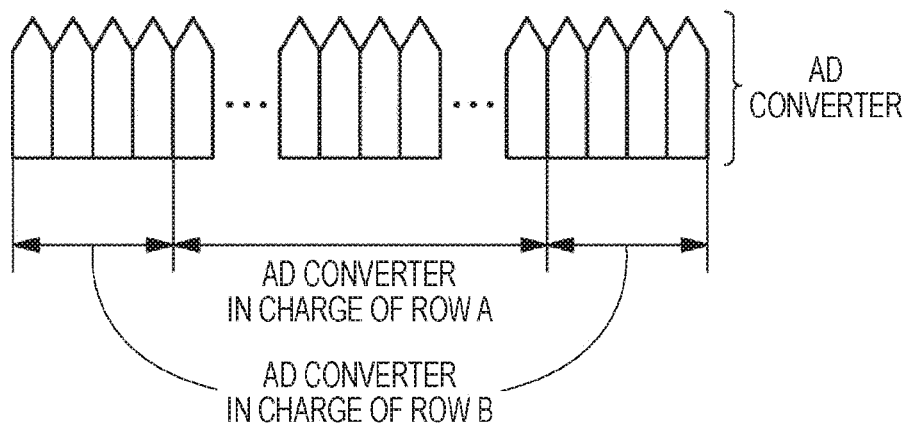

SIGNAL READING ROUTE OF ROW A

SIGNAL READING ROUTE OF ROW B

SIGNAL READING ROUTE OF ROW A

SIGNAL READING ROUTE OF ROW B

IMAGING DEVICE AND ELECTRONIC APPARATUS FOR EFFECTIVE PIXEL SIGNAL READING

CROSS REFERENCE TO RELATED APPLICATIONS

This application is a U.S. National Phase of International Patent Application No. PCT/JP2018/046585 filed on Dec. 18, 2018, which claims priority benefit of Japanese Patent Application No. JP 2018-009367 filed in the Japan Patent Office on Jan. 24, 2018. Each of the above-referenced applications is hereby incorporated herein by reference in its entirety.

TECHNICAL FIELD

The present disclosure relates to an imaging device and an electronic apparatus.

BACKGROUND ART

One of methods for reading a pixel signal in an imaging device is so-called binning reading for reading a pixel signal as assuming a plurality of pixels as a single pixel. According to binning reading, it is possible to increase a reading speed, reduce a data rate, and increase sensitivity.

Japanese Patent Application Laid-Open No. 2009-296451 (Patent Document 1) discloses a solid-state imaging device that makes wire connection compliant to binning reading on a specific pixel group in a plane of a pixel array unit and performs binning reading by a circuit in a different channel from a channel of full reading for reading signals of all pixels.

CITATION LIST

Patent Document

Patent Document 1: Japanese Patent Application Laid-Open No. 2009-296451

SUMMARY OF THE INVENTION

Problems to be Solved by the Invention

However, in the conventional technology described in Patent Document 1, since a pixel used for binning reading is fixed, it is not possible to read a signal of an optional pixel for each pixel. Here, the problem has been described by taking the case of binning read as an example. However, the similar as in a case of binning reading applies to a case of special reading such as cutout reading for reading a signal of a pixel in a specific region and thinning reading for skipping a pixel row at a certain row cycle and reading a signal of a pixel in a predetermined pixel row.

Therefore, an object of the present disclosure is to provide an imaging device that can read a signal of an optional pixel for each pixel regarding a pixel used for special reading such as binning reading and an electronic apparatus including the imaging device.

Solutions to Problems

An imaging device according to the present disclosure to achieve the above object includes:

a plurality of pixel units each including a first pixel unit and a second pixel unit; and a vertical signal line, in which each of the first pixel unit and the second pixel unit includes an amplification transistor, a selection transistor connected between the amplification transistor and the vertical signal line, and a connection unit that selectively connects between a common connection node of the amplification transistor and the selection transistor of the first pixel unit and a common connection node of the amplification transistor and the selection transistor of the second pixel unit.

Furthermore, an electronic apparatus according to the present disclosure to achieve the above object includes the imaging device having the above configuration.

BRIEF DESCRIPTION OF DRAWINGS

FIG. 15 is an explanatory diagram of a first example of cutout reading according to a second embodiment.

MODE FOR CARRYING OUT THE INVENTION

Figure 1:
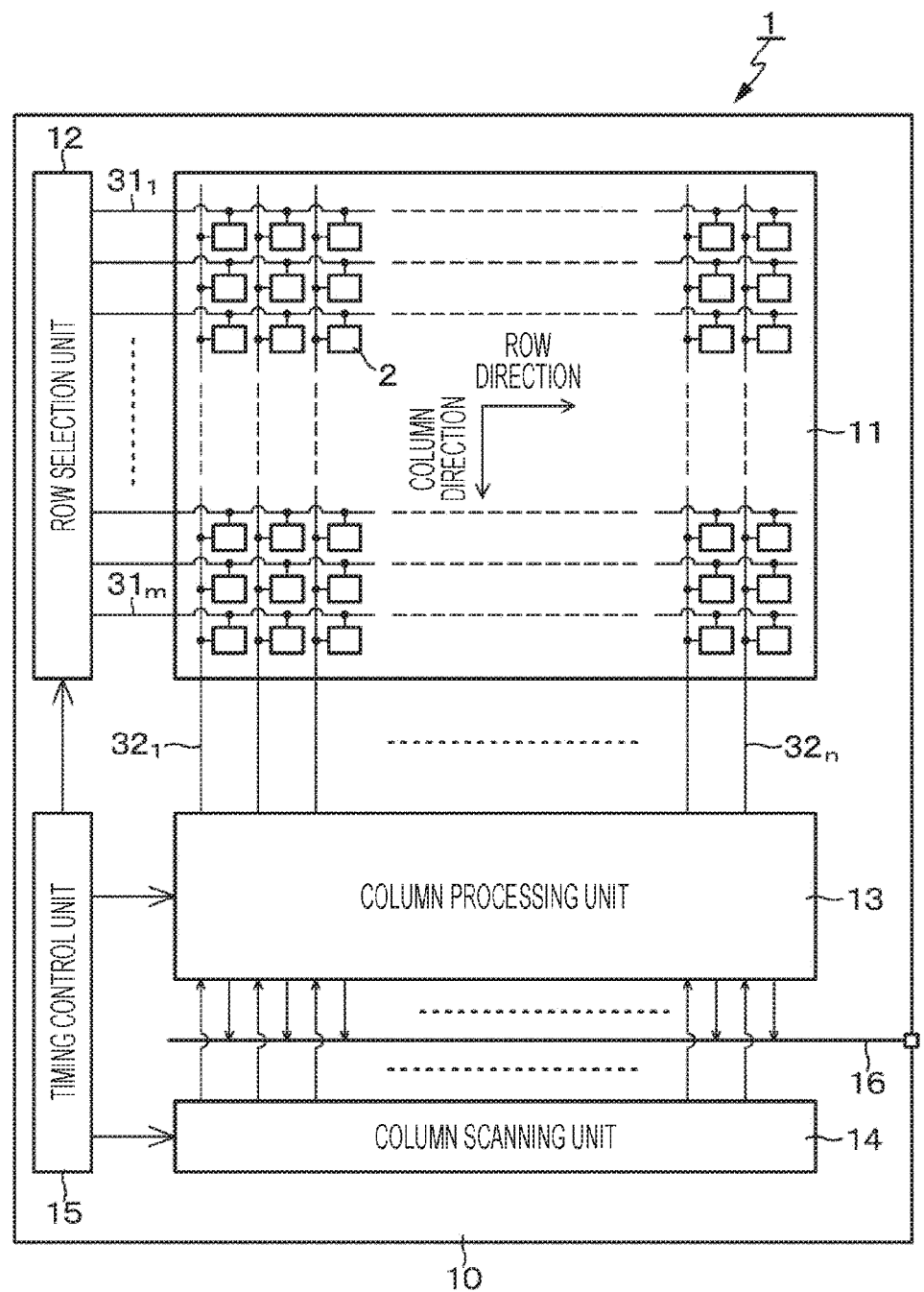
FIG. 1 is a block diagram schematically illustrating a system configuration of an imaging device to which the technology according to the present disclosure is applied.

Embodiments of the present disclosure will be described in detail below with reference to the drawings. The technology of the present disclosure is not limited to the embodiments, and various values, materials, or the like in the embodiments are only exemplary. In the following description, the same elements or the elements having the same functions are denoted with the same reference numerals, and overlapped description is omitted. Note that the description will be made in the following order.

1. Overall Description of Imaging Device And Electronic Apparatus According to Present Disclosure
2. Imaging Device to Which Technology According to Present Disclosure Is Applied
  2-1. System Configuration
  2-2. Circuit Configuration of Pixel
  2-3. Single Pixel Unit
  2-4. Binning Reading
3. Embodiments
  3-1. First Embodiment (Example of Binning Reading)
  3-2. Second Embodiment (Example of Cutout Reading)
  3-3. Third Embodiment (Example of Thinning Reading)
  3-4. Modification of Embodiment
  3-5. Application Example of Embodiment
4. Electronic Apparatus (Example of Camera Module)
5. Configuration That Present Disclosure Can Have <Overall Description of Imaging Device and Electronic Apparatus According to Present Disclosure>

In an imaging device and an electronic apparatus according to the present disclosure, a connection unit can have a configuration that selectively connects a single or a plurality of second pixel units to a first pixel unit in a unit group having a plurality of pixel units as a unit. At this time, a configuration can be used in which a single of each pixel of the first pixel unit and the second pixel unit is output through a single vertical signal line belonging to the same unit group.

In the imaging device and the electronic apparatus according to the present disclosure including the preferred configuration described above, a pixel unit can have a configuration including a first pixel group and a second pixel group. At this time, a configuration can be used that includes a reset transistor, an amplification transistor, and a selection transistor shared by the first pixel group and the second pixel group. The reset transistor resets a floating diffusion for converting a charge photoelectrically converted by each pixel in the same pixel unit into a pixel signal. The amplification transistor reads the pixel signal converted by the floating diffusion. The selection transistor selectively outputs the pixel signal read by the amplification transistor to a single vertical signal line belonging to the same unit group.

Moreover, in the imaging device and the electronic apparatus according to the present disclosure including the preferred configuration described above, the connection unit can have a configuration which is provided for each pixel unit and includes a connection transistor of which one end is connected to a common connection node of the amplification transistor and the selection transistor.

Furthermore, in the imaging device and the electronic apparatus according to the present disclosure including the preferred configuration described above, each of the first pixel group and the second pixel group can have a configuration including four pixels arranged in two rows and two columns. Furthermore, a configuration can be used in which transfer transistors of the respective four pixels in the first pixel group and the second pixel group are arranged in a square. Then, two transfer transistors among the reset transistor, the amplification transistor, and the selection transistor can be disposed between the first pixel group and the second pixel group in correspondence with the transfer transistors arranged in a square, and the remaining one transistor and the connection transistor can be arranged adjacent to the transfer transistors arranged in a square in the first pixel group.

Furthermore, in the imaging device and the electronic apparatus according to the present disclosure including the preferred configuration described above, the connection unit can have a configuration that realizes binning reading for reading a signal of a pixel as assuming a plurality of pixels as a single pixel, realizes cutout reading for reading a signal of a pixel in a specific region, or realizes thinning reading for reading a signal of a pixel in a predetermined pixel row.

<Imaging Device to Which Technology According to Present Disclosure is Applied>

[System Configuration]

First, a system configuration of an imaging device to which the technology according to the present disclosure is applied will be described. In the present embodiment, as an imaging device, a complementary metal oxide semiconductor (CMOS) image sensor which is a kind of an X-Y address type imaging device will be described as an example. The CMOS image sensor is an image sensor manufactured by applying or partially using a CMOS process.

FIG. 1 is a block diagram schematically illustrating a system configuration of an imaging device to which the technology according to the present disclosure is applied. An imaging device 1 according to the present application example has a configuration including a pixel array unit 11 formed on a semiconductor substrate 10 and a peripheral circuit unit disposed around the pixel array unit 11. The peripheral circuit unit of the pixel array unit 11 includes, for example, a row selection unit 12, a column processing unit 13, a column scanning unit 14, a timing control unit 15, or the like.

In the pixel array unit 11, pixels 2 each including a photoelectric conversion unit are two-dimensionally arranged in a row direction and a column direction, that is, in a matrix. Here, the row direction indicates an arrangement direction of each pixel 2 in the pixel row (that is, horizontal direction), and the column direction indicates an arrangement direction of each pixel 2 in the pixel column (that is, vertical direction). The pixel 2 generates and accumulates photoelectric charges according to a received light amount by performing photoelectric conversion. A specific circuit configuration of the pixel 2 will be described later.

In the pixel array unit 11, pixel driving lines $31_1$ to $31_m$ (may be collectively referred to as "pixel driving line 31" below) are wired for the respective pixel rows along the row direction with respect to the pixel arrangement in a matrix. Furthermore, vertical signal lines $32_1$ to $32_n$ (may be correctively referred to as "vertical signal line 32" below) are wired for the respective pixel columns along the column direction. The pixel driving line 31 transmits a driving signal used to perform driving when a signal is read from the pixel 2. Although the single pixel driving line 31 is illustrated in FIG. 1 as the pixel driving line 31, the number of pixel driving lines 31 is not limited to one. One end of the pixel driving line 31 is connected to an output terminal corresponding to each row of the row selection unit 12.

The row selection unit 12 includes a shift register, an address decoder, or the like and drives all the pixels 2 at the same time or the pixels 2 in unit of rows of the pixel array unit 11 under control by the timing control unit 15. That is, the row selection unit 12 is included in a driving unit that drives each pixel 2 of the pixel array unit 11, together with the timing control unit 15 that controls the row selection unit 12.

A pixel signal read from each pixel 2 in the pixel row selected and scanned by the row selection unit 12 is supplied to the column processing unit 13 through each of the vertical signal lines $32_1$ to $32_n$. The column processing unit 13 executes predetermined signal processing on the pixel signal output from each pixel 2 in the selected row through each of the vertical signal lines $32_1$ to $32_n$ for each pixel column of the pixel array units 11 and temporarily holds the signal on which the signal processing has been executed.

As the predetermined signal processing by the column processing unit 13, analog-digital conversion processing for converting an analog pixel signal read from the pixel 2 into a digital signal, noise removal processing by correlated double sampling (CDS), or the like can be exemplified. However, the signal processing described here is merely an example, and the predetermined signal processing by the column processing unit 13 is not limited to these.

In the column processing unit 13, an analog-digital converter that converts an analog pixel signal into a digital signal is provided, for example, in a one-to-one relationship with respect to the pixel column, that is, for each pixel column. As the analog-digital converter, a known analog-digital converter can be used. Specifically, as the analog-digital converter, a single-slope-type analog-digital converter, a successive-approximation-type analog-digital converter, or a delta-sigma modulation-type (ΔΣ modulation type) analog-digital converter can be exemplified. However, the analog-digital converter is not limited to these.

The column scanning unit 14 includes a shift register, an address decoder, or the like and selects a unit circuit corresponding to the pixel column of the column processing unit 13, for example, a unit circuit including the analog-digital converter in order under the control by the timing control unit 15. By selecting and scanning by the column scanning unit 14, the pixel signals on which the signal processing has been executed by the column processing unit 13 are sequentially read to a horizontal bus 16 and are output to outside of the semiconductor substrate 10 through the horizontal bus 16.

The timing control unit 15 generates various timing signals, clock signals, control signals, or the like and drives and controls the row selection unit 12, the column processing unit 13, the column scanning unit 14, and the like on the basis of the generated signals.

Note that, in this example, a case has been described where the present disclosure is applied to a so-called imaging device having a flat structure, that is, a structure in which a circuit part including the row selection unit 12, the column processing unit 13, the column scanning unit 14, the timing control unit 15, and the like is formed on the semiconductor substrate 10 where the pixel array unit 11 is formed. However, the present disclosure is not limited to this. That is, the technology according to the present disclosure can be applied to a so-called imaging device having a laminated structure in which at least two semiconductor substrates are laminated. In a case of the imaging device having the laminated structure, the pixel array unit 11 is disposed on a semiconductor substrate in a first layer, and the circuit part including the row selection unit 12, the column processing unit 13, the column scanning unit 14, the timing control unit 15, and the like is disposed on another semiconductor substrate.

According to the imaging device 1 having this laminated structure, it is only necessary for the semiconductor substrate in the first layer to have a size (area) where the pixel array unit 11 is formed. Therefore, the size (area) of a first semiconductor substrate in the first layer and the size of the entire chip can be reduced. Moreover, a process suitable for manufacturing the pixel 2 can be applied to the semiconductor substrate in the first layer, and a process suitable for manufacturing the circuit part can be applied to the other semiconductor substrate. Therefore, there is an advantage such that a process can be optimized when the imaging device 1 is manufactured.

[Circuit Configuration of Pixel]

Figure 2:
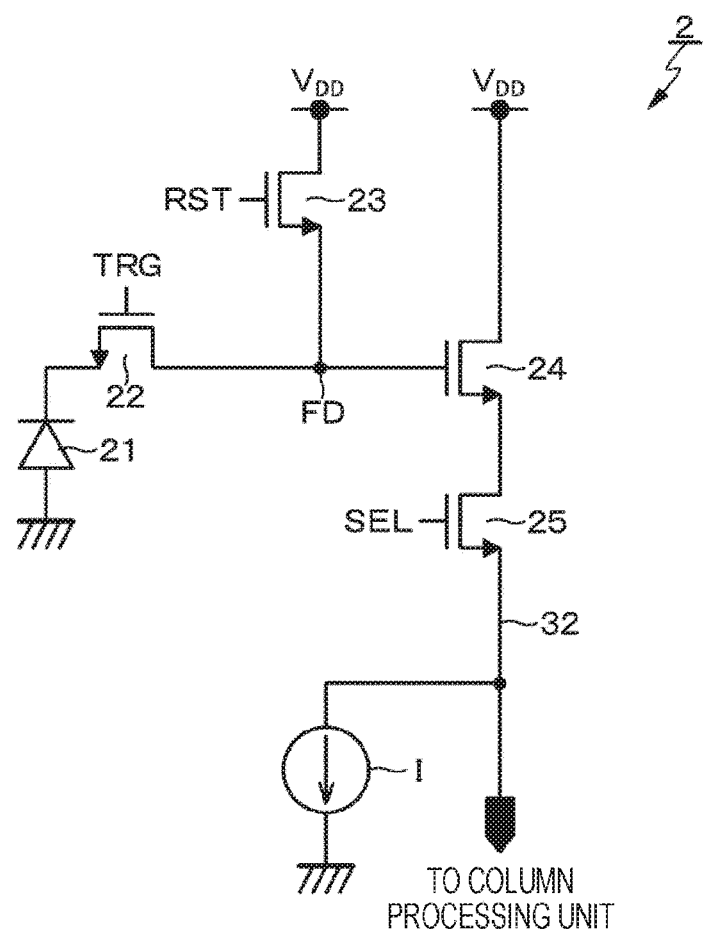
FIG. 2 is a circuit diagram illustrating an exemplary circuit configuration of a pixel.

FIG. 2 is a circuit diagram illustrating an exemplary circuit configuration of the pixel 2. The pixel 2 includes, for example, a photodiode 21 as a photoelectric conversion unit and has a circuit configuration including a transfer transistor 22, a reset transistor 23, an amplification transistor 24, and a selection transistor 25 in addition to the photodiode 21.

Note that, here, as four transistors including the transfer transistor 22, the reset transistor 23, the amplification transistor 24, and the selection transistor 25, for example, an N-channel MOS field effect transistor is used. However, a combination of conductivity types of the four transistors 22 to 25 exemplified here is merely an example, and the combination thereof is not limited to this.

As the pixel driving line 31 described above for the pixel 2, a plurality of pixel driving lines is wired in common to each pixel 2 in the same pixel row. The plurality of pixel driving lines is connected to the output terminal corresponding to each pixel row of the row selection unit 12 in pixel row unit. The row selection unit 12 appropriately outputs a transfer signal TRG, a reset signal RST, and a selection signal SEL to the plurality of pixel driving lines.

An anode electrode of the photodiode 21 is connected to a power supply on the low potential side (for example, ground). The photodiode 21 photoelectrically converts the received light into the photoelectric charges (here, photoelectron) having a charge amount according to the amount of the received light and accumulates the photoelectric charges. A cathode electrode of the photodiode 21 is electrically connected to a gate electrode of the amplification transistor 24 via the transfer transistor 22. Here, a region to which the gate electrode of the amplification transistor 24 is electrically connected is a floating diffusion (floating diffusion region/impurity diffusion region) FD. The floating diffusion FD is a charge-to-voltage conversion unit that converts charges into a voltage.

The row selection unit 12 applies the transfer signal TRG which is active at the high level (for example, $V_{DD}$ level) to a gate electrode of the transfer transistor 22. The transfer transistor 22 is conducted in response to the transfer signal TRG so as to transfer the photoelectric charges which are photoelectrically converted by the photodiode 21 and accumulated in the photodiode 21 to the floating diffusion FD.

The reset transistor 23 is connected between a node of a high-potential-side power supply $V_{DD}$ and the floating diffusion FD. The row selection unit 12 applies the reset signal RST which is active at the high level to a gate electrode of the reset transistor 23. The reset transistor 23 is conducted in response to the reset signal RST and resets the floating diffusion FD by discarding the charge in the floating diffusion FD to the node of the voltage $V_{DD}$.

The gate electrode of the amplification transistor 24 is connected to the floating diffusion FD, and a drain electrode is connected to the node of the high-potential-side power supply $V_{DD}$. The amplification transistor 24 is an input unit of a source follower that reads a signal obtained by the photoelectric conversion by the photodiode 21. That is, a source electrode of the amplification transistor 24 is connected to the vertical signal line 32 via the selection transistor 25. Then, the amplification transistor 24 and a current source I connected to one end of the vertical signal line 32 are included in a source follower that converts a voltage of the floating diffusion FD into a potential of the vertical signal line 32.

For example, a drain electrode of the selection transistor 25 is connected to the source electrode of the amplification transistor 24, and a source electrode is connected to the vertical signal line 32. The selection signal SEL that is active at the high level is applied from the row selection unit 12 to a gate electrode of the selection transistor 25. The selection transistor 25 is conducted in response to the selection signal SEL and transmits a signal output from the amplification transistor 24 to the vertical signal line 32 by selecting the unit pixel 2.

Note that, here, as the pixel circuit of the pixel 2, a 4 Tr circuit configuration including the transfer transistor 22, the reset transistor 23, the amplification transistor 24, and the selection transistor 25, that is, four transistors (Tr) has been described as an example. However, the circuit configuration is not limited to the 4 Tr circuit configuration. Furthermore, when a substrate surface on which a wiring layer is provided is assumed as a front surface (front side), a pixel structure can be a back-illuminated pixel structure that takes in irradiation light from a rear surface side opposite to the front surface or can be a front-illuminated pixel structure that takes in irradiation light from the front surface side.

[Single Pixel Unit]

In the above, as the imaging device 1, the configuration in which the single vertical signal line 32 is wired for each pixel column is exemplified. However, regarding an imaging device for mobile use in recent years, a camera module is downsized, and a pixel is miniaturized, and the imaging device has a configuration in which a single vertical signal line 32 is wired for a plurality of pixel columns.

Figure 3:
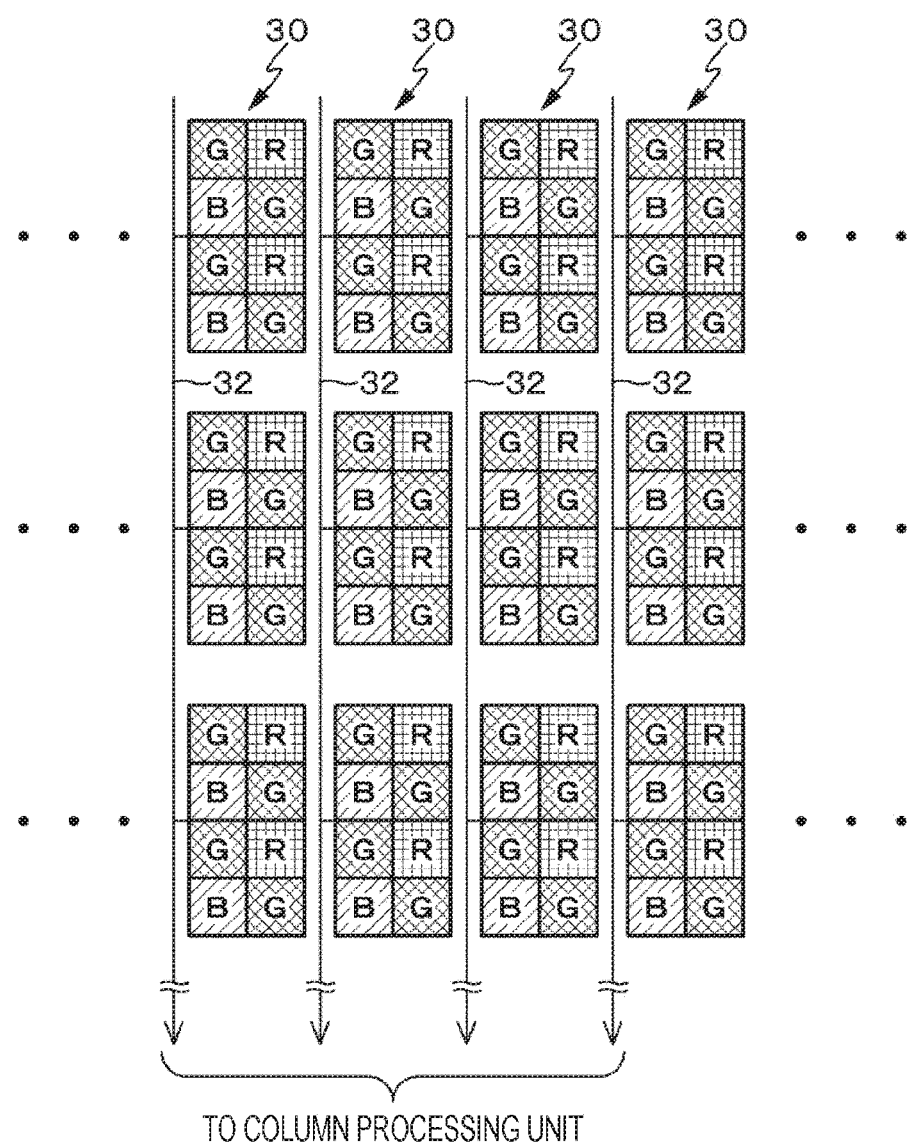
FIG. 3 is a simplified diagram illustrating a configuration in which a single vertical signal line is wired for each column of pixel units.

As an example, in a color-applicable imaging device 1, a configuration is illustrated in FIG. 3 in which the single vertical signal line 32 is wired for each column of the pixel units 30 in a case where an arrangement pattern of a color filters is, for example, the Bayer arrangement of red (R), green (G), and blue (B) and when it is assumed that two horizontal pixels×four vertical pixels (pixels in two columns and two rows) form the single pixel unit 30. This case indicates an exemplary configuration in which the single vertical signal line 32 is wired for two pixel columns. The arrangement pattern of the color filters is not limited to the RGB Bayer arrangement.

Figure 4:
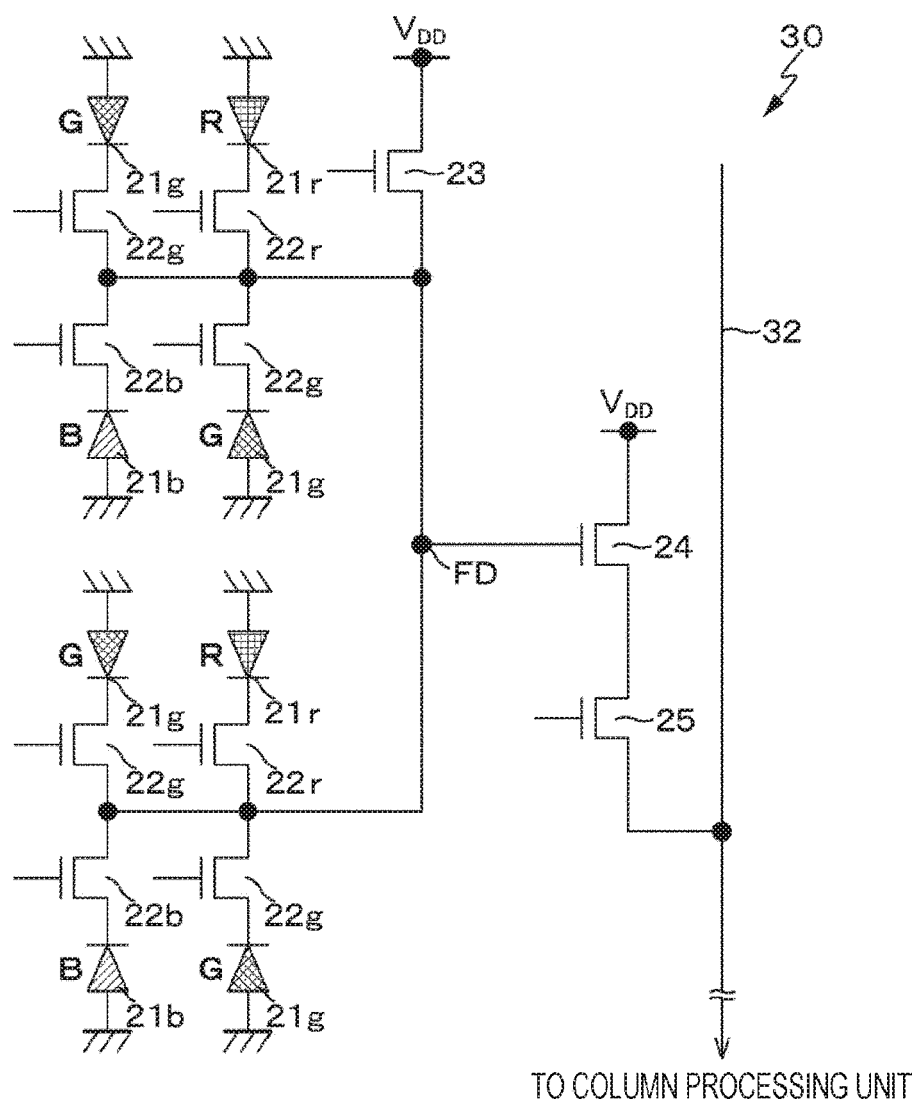
FIG. 4 is a circuit diagram illustrating a circuit configuration of a pixel circuit corresponding to a single pixel unit of two horizontal pixels×four vertical pixels.

A pixel circuit corresponding to a single pixel unit 30 including two horizontal pixels×four vertical pixels is illustrated in FIG. 4. The single pixel unit 30 including two horizontal pixels×four vertical pixels has a configuration in which a first pixel group including four upper pixels and a second pixel group including four lower pixels share the reset transistor 23, the amplification transistor 24, and the selection transistor 25 (pixel share). The pixel-sharing pixel circuit has an advantage such that the pixel can be miniaturized than a case where the reset transistor 23, the amplification transistor 24, and the selection transistor 25 are provided for each pixel.

In the pixel-sharing pixel circuit, the reset transistor 23 resets the floating diffusion FD that converts the charges photoelectrically converted by each pixel in the same pixel unit 30 into a pixel signal. The amplification transistor 24 reads the pixel signal converted by the floating diffusion FD. The selection transistor 25 selectively outputs the pixel signal read by the amplification transistor 24 to a single vertical signal line 32 belonging to the same unit group 40 (refer to FIG. 11).

Figure 5:
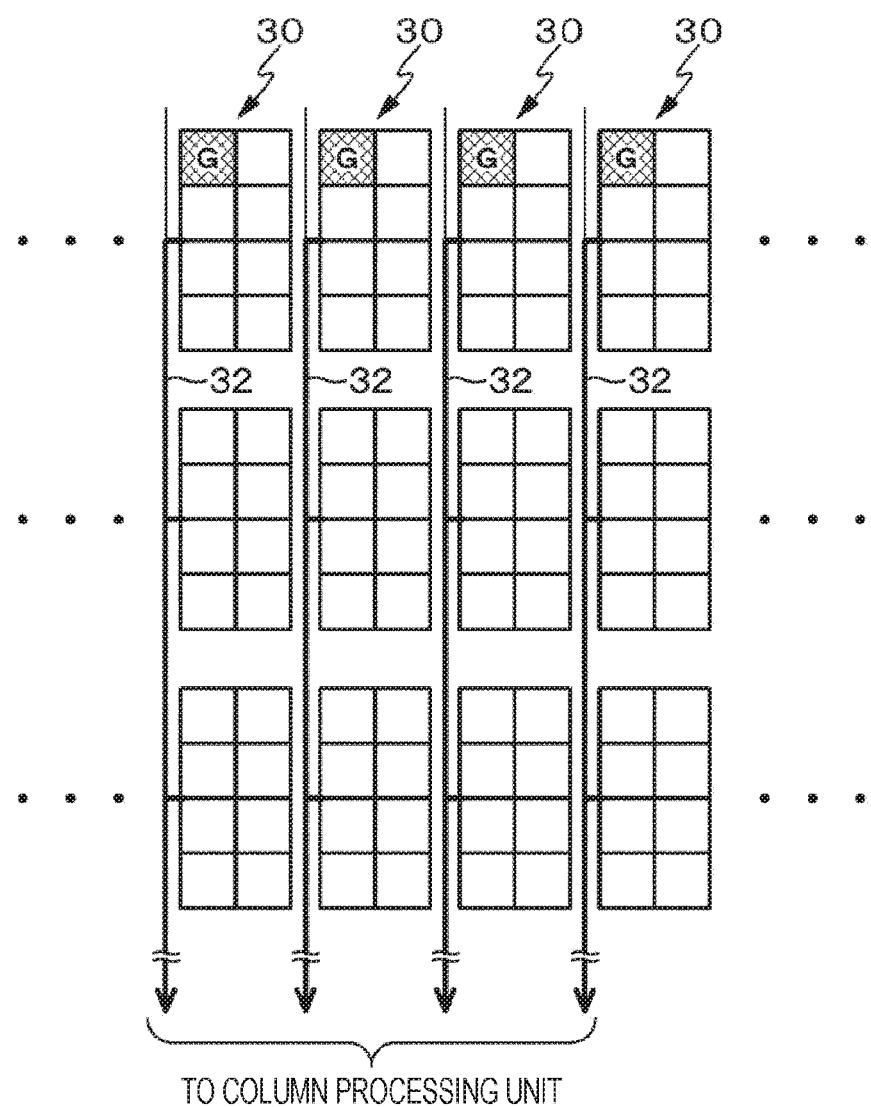
FIG. 5 is a diagram simply illustrating a state of a reading operation for one row in a case where an imaging device including two horizontal pixels×four vertical pixels as a single pixel unit reads signals of all the pixels.

FIG. 5 simply illustrates a state of a reading operation for one row in a case where the imaging device 1 including two horizontal pixels×four vertical pixels as the single pixel unit 30 reads signals of all the pixels. As is clear from FIG. 5, in a case where the signals of all the pixels are read, the pixel is selected in a pixel row unit, the signal of each pixel in the selected row (pixel G in example in FIG. 5) is read to the vertical signal line 32 corresponding to the column of the pixel units 30 and is supplied to the column processing unit 13 through the vertical signal line 32.

Note that, here, a case has been described where the single pixel unit 30 includes eight pixels including two horizontal pixels×four vertical pixels as an example. However, a case may be used where the single pixel unit 30 includes a plurality of pixels other than the eight pixels including two horizontal pixels×four vertical pixels. Furthermore, the single pixel unit 30 is not limited to a case of the plurality of pixels. The single pixel unit 30 may include a single pixel, that is, there may be a case where a single pixel unit=a single pixel.

[Binning Reading]

Next, binning reading which is advantageous for increasing a reading speed, reducing a data rate, and increasing sensitivity will be described.

Figure 6:
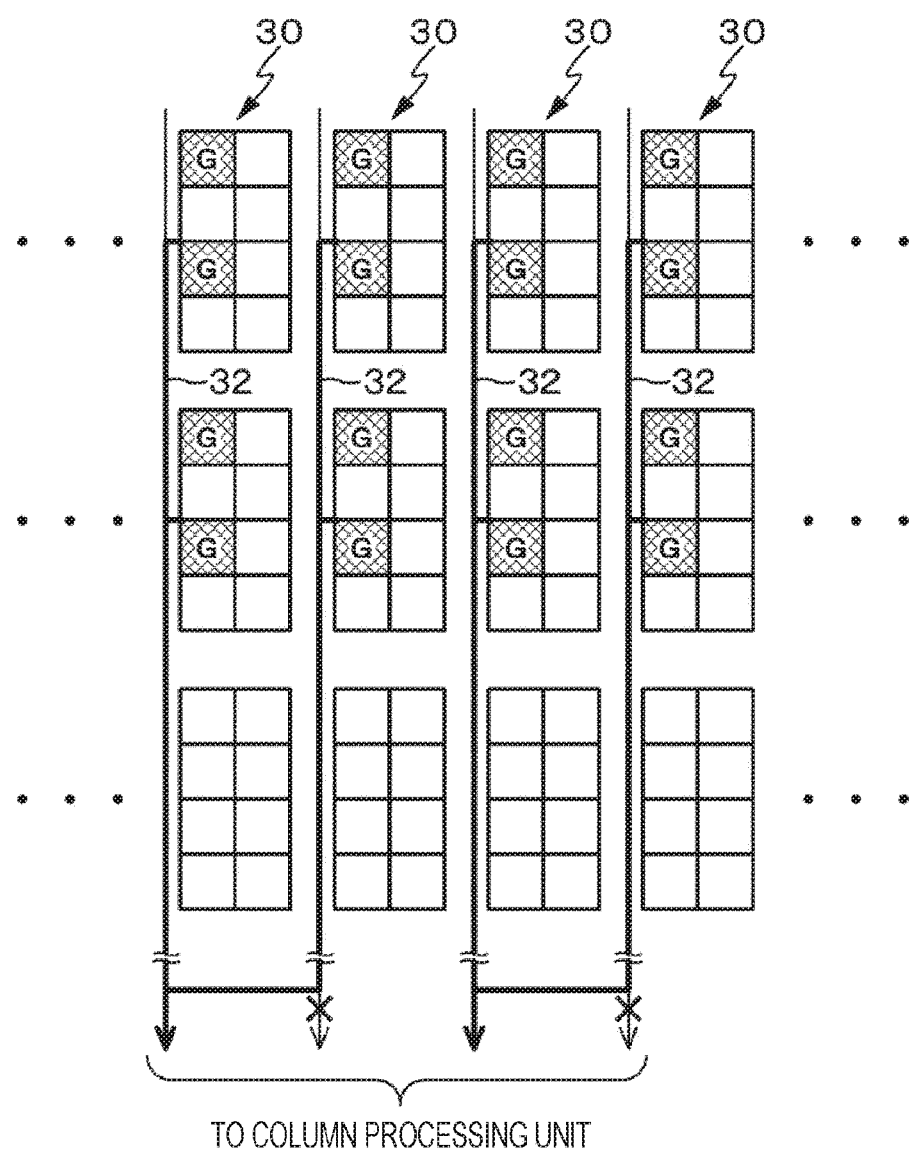
FIG. 6 is a diagram simply illustrating a state of a reading operation in a case where binning reading is performed on two horizontal pixels×two vertical pixels.

FIG. 6 simply illustrates a state of a reading operation in a case where binning reading is performed on two horizontal pixels×two vertical pixels. Regarding the two vertical pixels, since the pixels having the same color are included in the same pixel unit 30, addition reading can be performed by simultaneously reading signals of the two pixels and selecting the pixels.

Regarding the two horizontal pixels, the column processing unit 13 performs addition by switching a mode of a selector 33 (refer to FIG. 7) disposed immediately before the analog-digital converter to a mode in which addition is performed between adjacent columns of the pixel units 30. In this case, all the vertical signal lines 32 are occupied. However, since horizontal addition is performed between the adjacent columns of the pixel unit 30, the pixel signal is not supplied to the analog-digital converters in every other column of the pixel units 30, and an analog-digital conversion operation is not performed.

Figure 7:
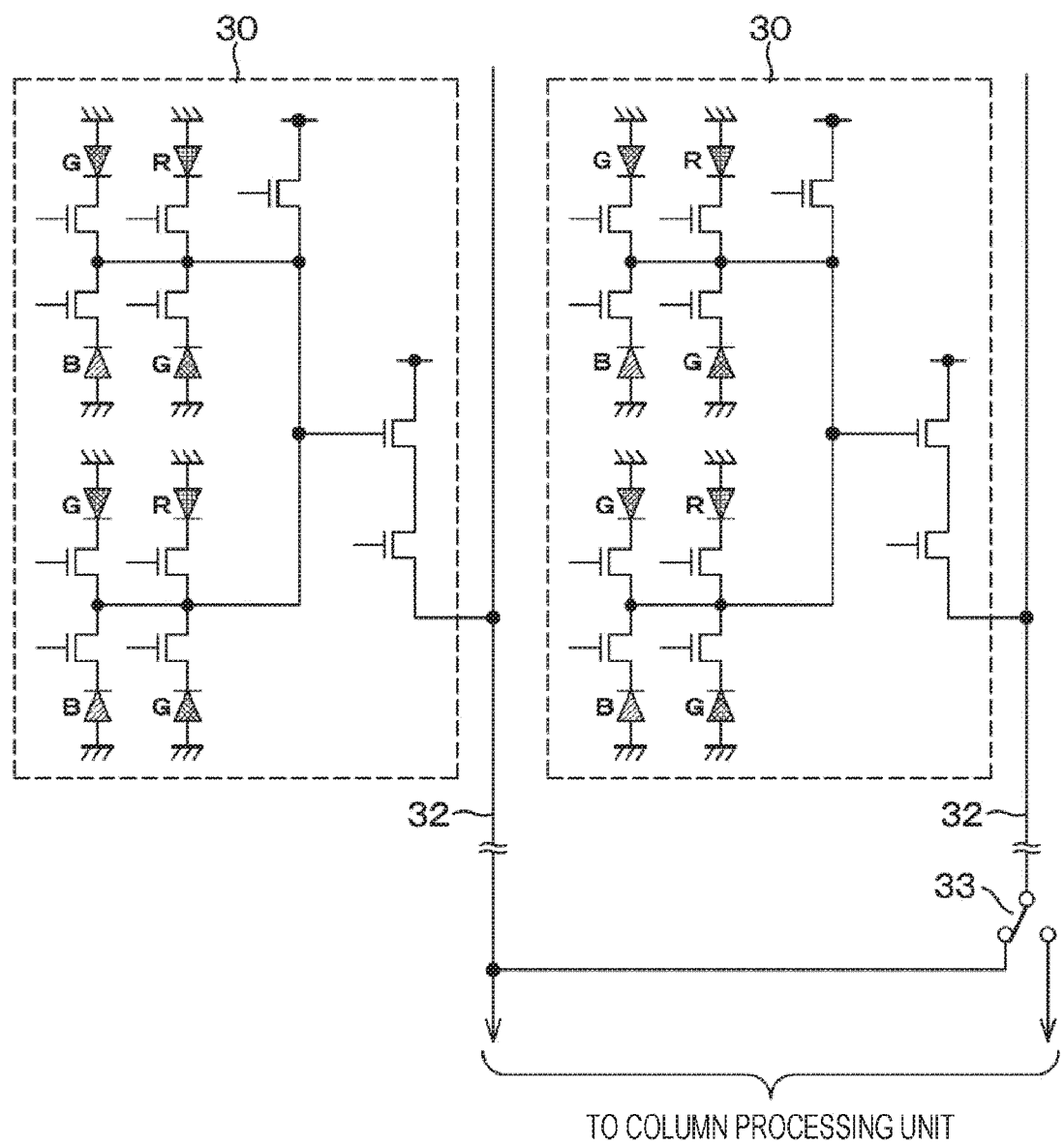
FIG. 7 is a circuit diagram illustrating a circuit configuration in a case where binning reading is performed on two horizontal pixels×two vertical pixels.

This makes a half of the analog-digital converters be spare. FIG. 7 is a circuit diagram illustrating a circuit configuration in a case where binning reading is performed on two horizontal pixels×two vertical pixels. As illustrated in FIG. 7, the selectors 33 are disposed immediately before the analog-digital converters in every other column of the pixel units 30.

Figure 8:
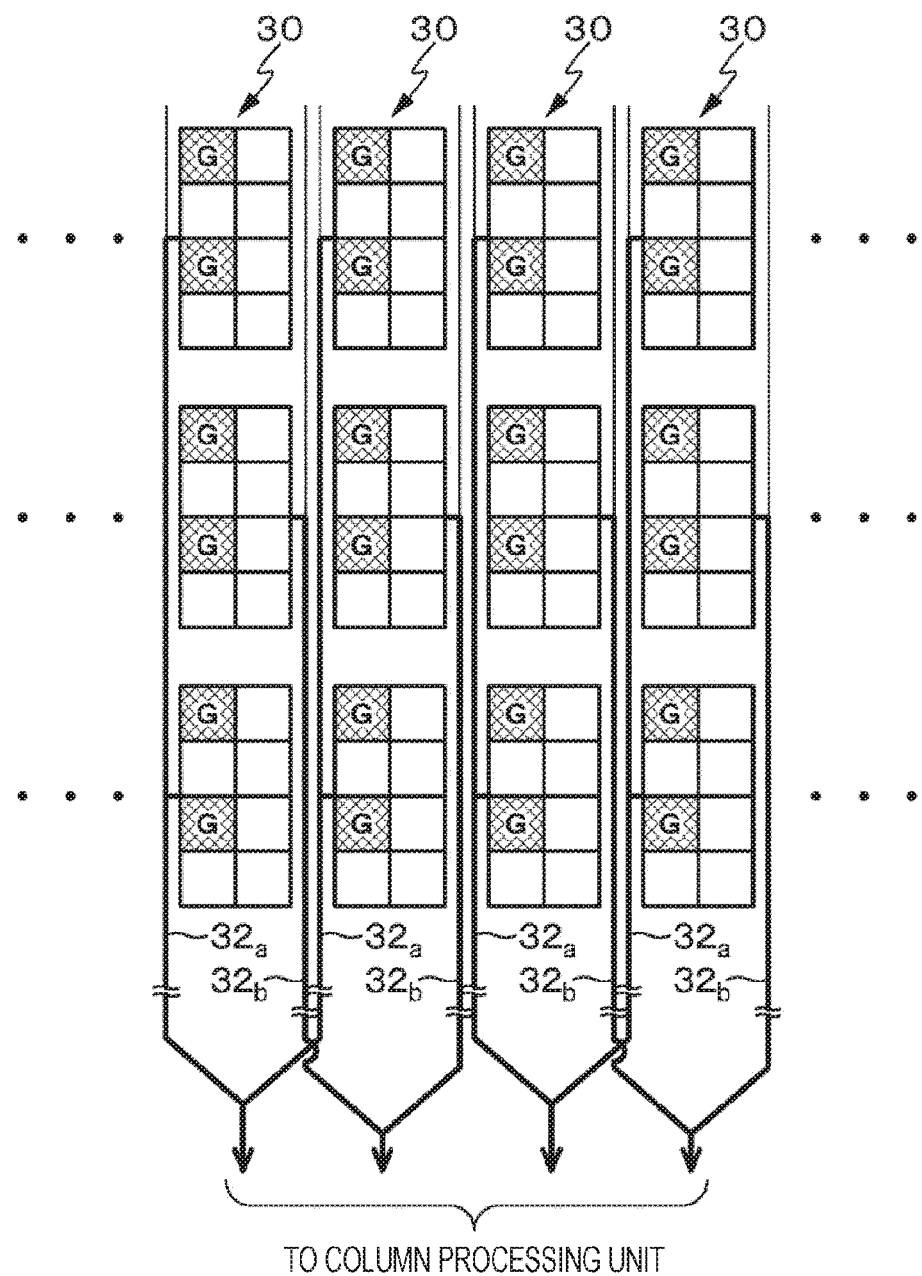
FIG. 8 is a diagram simply illustrating a state of a binning reading operation in a case where two vertical signal lines are wired for each column of the pixel units.

When binning reading is performed, in order to make no spare analog-digital converters and to increase the reading speed by using all the analog-digital converters, it is only required to double the number of vertical signal lines 32. Specifically, as illustrated in FIG. 8, by wiring two vertical signal lines 32 (32$_a$ and 32$_b$) for each column of the pixel units 30, and a path used to input the signal of the adjacent columns of the pixel unit 30 into the spare analog-digital converter is made. FIG. 8 is a diagram simply illustrating a state of a binning reading operation in a case where two vertical signal lines 32 are wired for each column of the pixel units 30.

Figure 9:
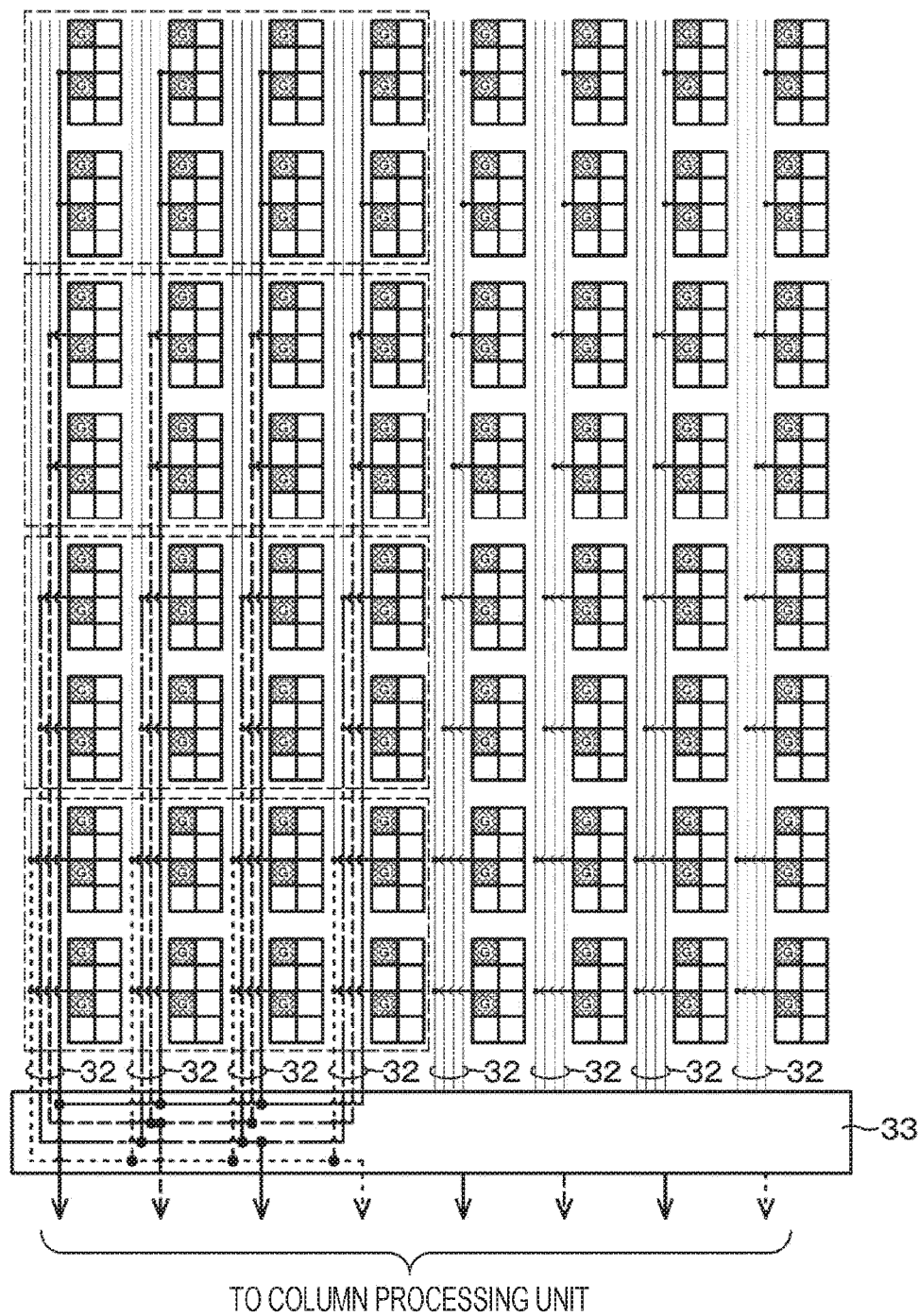
FIG. 9 is a diagram simply illustrating a state of a binning reading operation in a case where four vertical signal lines are wired for each column of the pixel units.

Since a case of the example illustrated in FIG. 8 is an example of binning reading on two horizontal pixels×two vertical pixels, binning reading can be realized by wiring two vertical signal lines 32 for each column of the pixel units 30. However, in order to realize binning reading on four horizontal pixels×four vertical pixels in the pixel unit 30 including eight horizontal pixels×eight vertical pixels, as illustrated in FIG. 9, four vertical signal lines 32 are wired for each column of the pixel units 30. As a result, there is a problem in that the wiring lines are congested and the selector 33 disposed immediately before the analog-digital converter is enlarged.

Embodiments

Therefore, the present disclosure has a configuration including a connection unit that selectively connects a common connection node of an amplification transistor 24 and a selection transistor 25 of a first pixel unit (one pixel unit) to a common connection node of an amplification transistor 24 and a selection transistor 25 of a second pixel unit (another pixel unit).

Here, in a case of the pixel configuration illustrated in FIG. 2, the common connection node of the amplification transistor 24 and the selection transistor 25 is a connection node of a source electrode of the amplification transistor 24 and a drain electrode of the selection transistor 25. The pixel unit may include a plurality of pixels or a single pixel (single pixel unit=single pixel).

Figure 10:
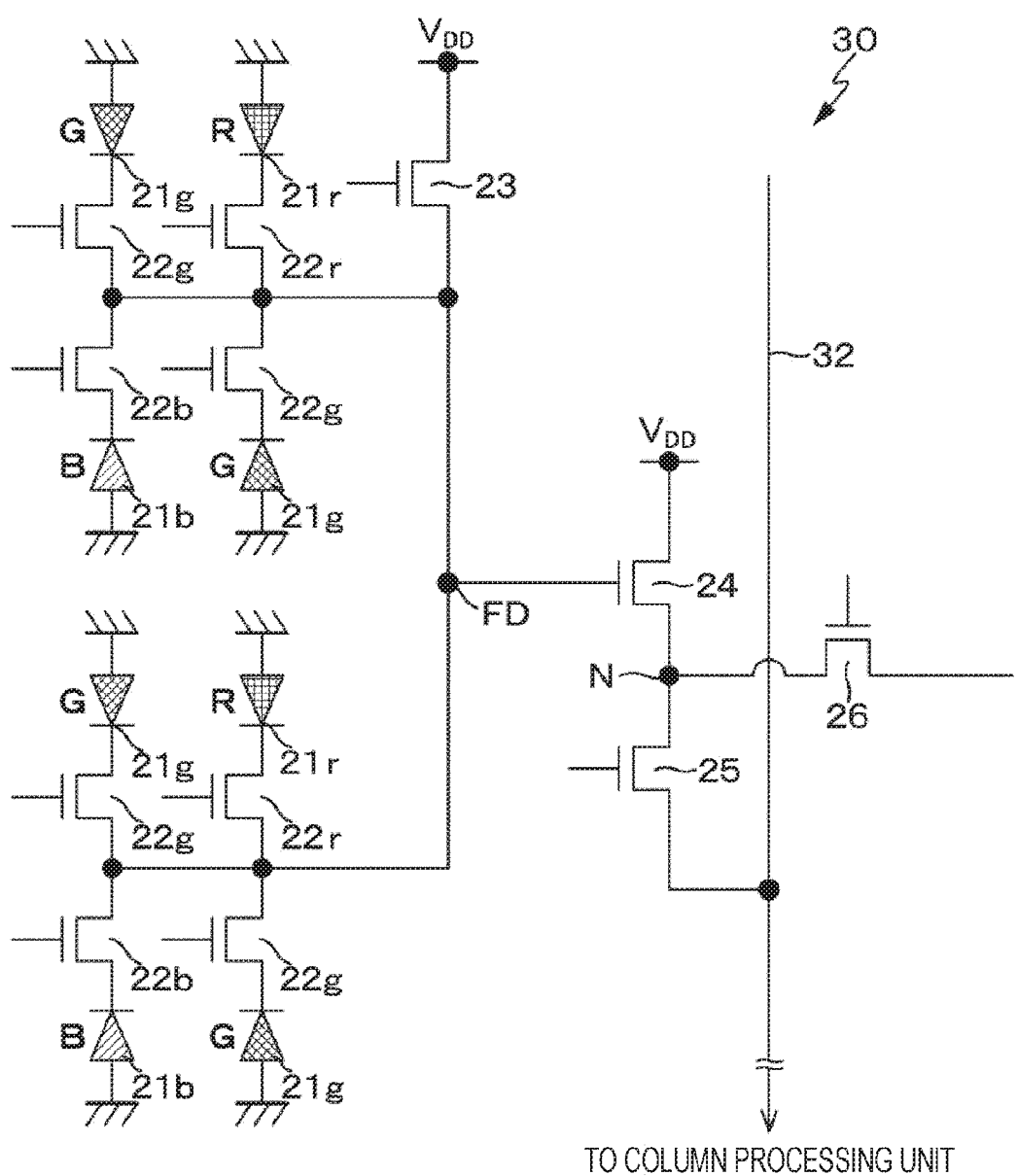
FIG. 10 is a circuit diagram illustrating a circuit configuration of a pixel circuit according to an embodiment of the present disclosure.

In FIG. 10, for example, a circuit configuration of a pixel circuit according to the embodiment of the present disclosure corresponding to a single pixel unit (first pixel unit/one pixel unit) including two horizontal pixels×four vertical pixels (two columns×four rows) is illustrated. One end of a connection transistor 26 that is an example of the connection unit is connected to a common connection node N of the amplification transistor 24 and the selection transistor 25. Another end of the connection transistor 26 is connected to a common connection node N of the amplification transistor 24 and the selection transistor 25 of the second pixel unit (the other pixel unit).

By providing the connection transistor 26 for each pixel unit 30, according to an action of the connection transistor 26, selection of exchange of pixel signals between the single pixel unit 30 and the other pixel unit 30 can be performed in the pixel array unit 11. This makes it possible to read a signal of an optional pixel for each pixel regarding pixels used for special reading such as binning reading without increasing the number of vertical signal lines 32.

Hereinafter, specific embodiments of the imaging device according to the present embodiment will be described assuming a case of binning reading among the special reading be a first embodiment, a case of cutout reading be a second embodiment, and a case of thinning reading be a third embodiment.

First Embodiment

Figure 11:
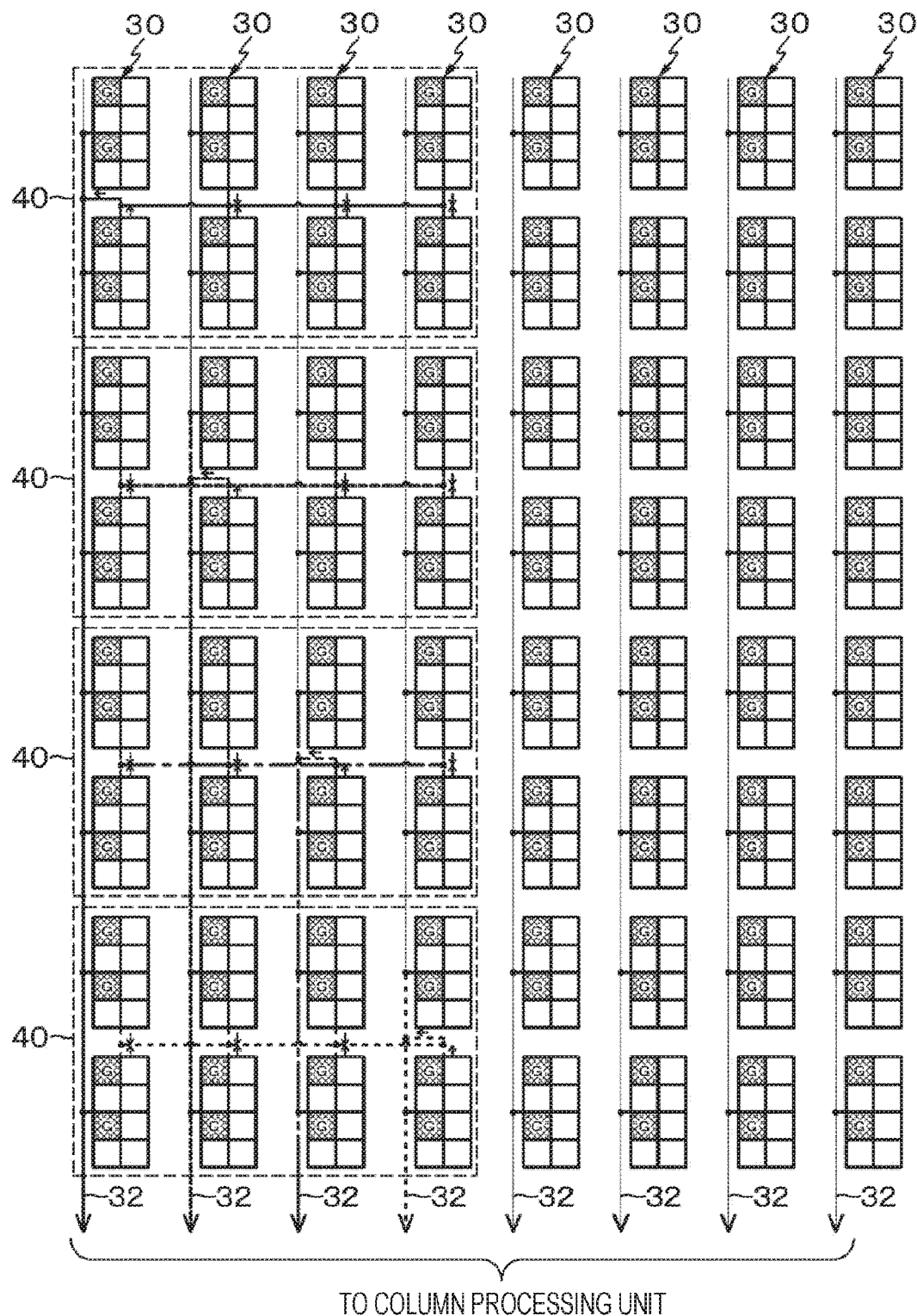
FIG. 11 is a diagram simply illustrating a state of a binning reading operation according to a first embodiment.

The first embodiment is an example of binning reading for reading a signal of a pixel as assuming a plurality of pixels as a single pixel. FIG. 11 simply illustrates a state of a binning reading operation according to the first embodiment. Here, as an example, a case is exemplified where a single pixel unit 30 includes two horizontal pixels×four vertical pixels and a single unit group 40 includes four horizontal pixel units×two vertical pixel units. The unit group 40 is a pixel unit group in units of the plurality of pixel units 30, that is, a pixel unit group including a set of the plurality of pixel units 30.

By including a connection transistor 26 (refer to FIG. 10) that selectively connects between common connection nodes N of amplification transistors 24 and selection transistors 25 in the plurality of pixel units 30, binning reading for reading a signal of a pixel as assuming a plurality of pixels as a single pixel can be realized even when a single vertical signal line 32 is wired for each column of the pixel units 30.

Figure 12:
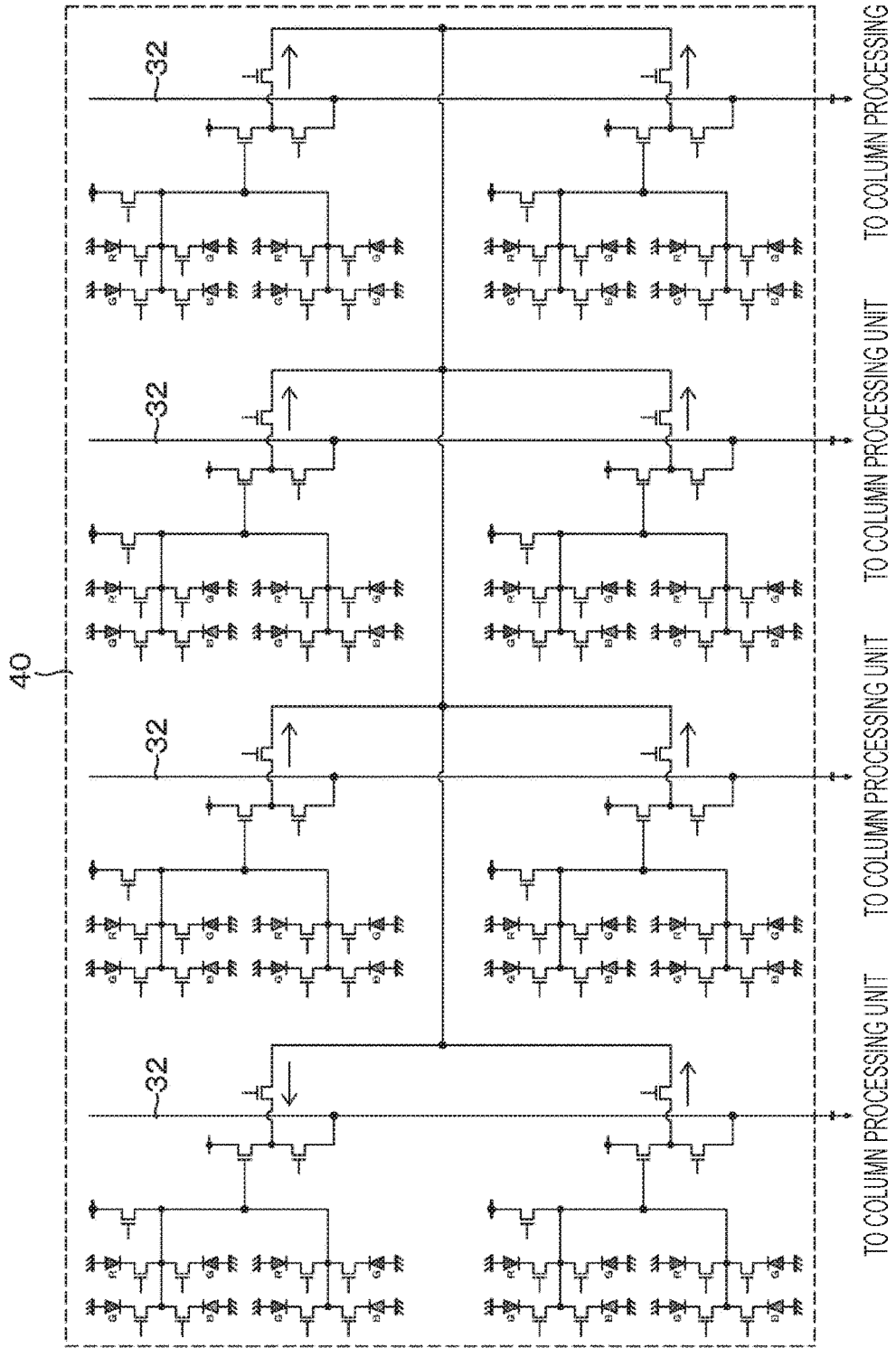
FIG. 12 is a circuit diagram illustrating a circuit configuration of a single unit group in binning reading according to the first embodiment.

The example in FIG. 11 is an example of binning reading on four horizontal pixels×four vertical pixels for reading a signal as assuming four horizontal pixels and four vertical pixels having the same color as a single pixel, in the unit group 40 including four horizontal pixel units×two vertical pixel units. FIG. 12 illustrates a circuit configuration of the single unit group 40 in binning reading according to the first embodiment. In FIGS. 11 and 12, an arrow (→) indicates a flow of a signal.

As is clear from FIGS. 11 and 12, by providing the connection transistor 26 for each pixel unit 30, according to an action of the connection transistor 26, a first pixel unit can be selectively connected to a plurality of second pixel units in the unit group 40. Then, a signal of each pixel in the first pixel unit and the second pixel unit is output through the single vertical signal line 32 belonging to the same unit group 40. With this operation, the signal of each pixel in the first pixel unit and the second pixel unit is added at the time of being output to the vertical signal line 32.

Here, a circuit operation of binning reading according to the first embodiment will be described. Here, for easy understanding, by using a case of binning reading between two adjacent pixel units 30$_1$ and 30$_2$ in the same row illustrated in FIG. 13A as an example, a basic circuit operation for binning reading according to the first embodiment will be described. FIG. 13B illustrates timing waveforms of a reset signal RST that drives a reset transistor 23, a transfer signal TRG that drives a transfer transistor 22, a selection signal SEL$_1$ (selection signal SEL$_2$) that drives a selection transistor 25, and a selection signal SEL$_3$ that drives the connection transistor 26. The selection signals SEL$_1$ and SEL$_2$ respectively drive the selection transistors 25 of the adjacent pixel units 30$_1$ and 30$_2$.

At a time $t_1$, both of the reset signal RST and the transfer signal TRG are active (high level state) and the reset transistor 23 and the transfer transistor 22 are conducted in the pixel units $30_1$ and $30_2$ to reset a floating diffusion FD and a photodiode 21.

Thereafter, at a time $t_2$, the selection signal $SEL_3$ becomes active and the connection transistor 26 is conducted in the pixel units $30_1$ and $30_2$ to electrically connect between common connection nodes $N_1$ and $N_2$ of the amplification transistors 24 and the selection transistors 25. With this operation, signals can be exchanged between the pixel units $30_1$ and $30_2$.

Next, at a time $t_3$, the selection signal $SEL_1$ becomes active and the selection transistor 25 is conducted in the pixel unit $30_1$ so as to electrically connect between the common connection node $N_1$ and the vertical signal line $32_1$. With this operation, the signal read by the amplification transistor 24 can be output to the vertical signal line $32_1$. On the other hand, the selection signal $SEL_2$ is not active (low level state). Therefore, in the pixel unit $30_2$, since the selection transistor 25 is not conducted, it is not possible to output the signal read by the amplification transistor 24 to the vertical signal line $32_1$.

Next, at a time $t_4$, the transfer signal TRG is active and the transfer transistor 22 is conducted in the pixel units $30_1$ and $30_2$, the charge photoelectrically converted by the photodiode 21 is transferred (read) to the floating diffusion FD. Then, in the pixel unit $30_1$, the signal read by the amplification transistor 24 is output to the vertical signal line $32_1$ through the selection transistor 25 in the conductive state.

On the other hand, in the pixel unit $30_2$, the signal read by the amplification transistor 24 is prevented from being output to the vertical signal line $32_2$ by the selection transistor 25 in a non-conductive state and is supplied to the pixel unit $30_1$ through the connection transistor 26 in the conductive state. As a result, the signal of the pixel unit $30_1$ and the signal of the pixel unit $30_2$ are added at the common connection node $N_1$ of the pixel unit $30_1$ and are output to the vertical signal line $32_1$ through the selection transistor 25 in the conductive state.

Figure 13A:
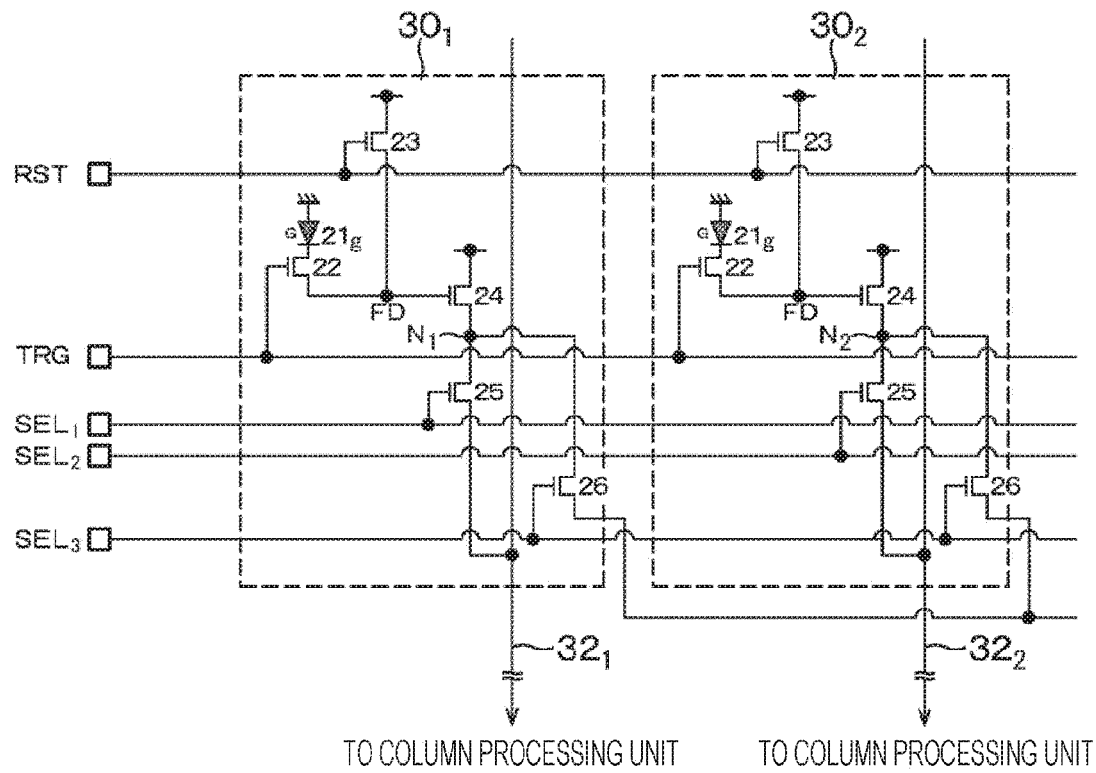
FIG. 13A is a circuit diagram illustrating a circuit configuration of adjacent two pixel units in the same row on which binning reading is performed.
Figure 13B:
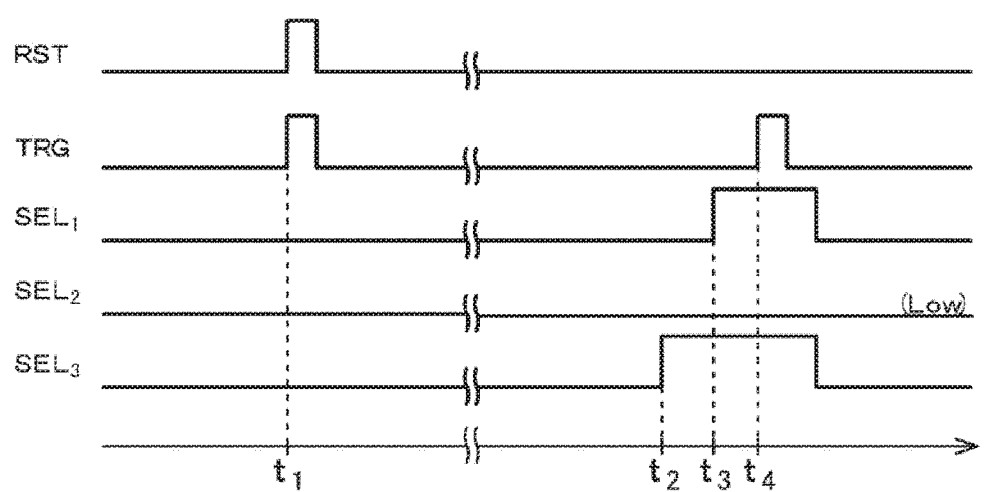
FIG. 13B is a timing waveform diagram of each signal for performing the binning reading operation.

The above is the basic circuit operation in a case of binning reading between the two adjacent pixel units $30_1$ and $30_2$ in the same row illustrated in FIG. 13A and corresponds to a circuit operation of two left pixel units 30 in the first row in FIG. 11. By appropriately reflecting this basic circuit operation to the other rows and the other columns, as is clear from FIG. 11, addition signals can be read by using all the vertical signal lines 32 belonging to the unit group 40. Furthermore, according to the action of the connection transistor 26, regarding the pixel used for binning reading, a signal of an optional pixel can be read for each pixel without increasing the number of vertical signal lines 32.

Then, by performing binning reading on N horizontal pixels×N vertical pixels, it is possible to increase the reading speed for $N^2$. Furthermore, binning reading can be realized by the single vertical signal line 32 for each column of the pixel units 30. Therefore, since consumption of wiring resources is smaller than a case where the technology according to the present disclosure is not used, the value of N can be increased. For example, when it is assumed that N=6 in an imaging device having 20 M pixels, an output of full 20 M and 30 fps and an output of 0.5 M and 1080 fps can be selectively performed. With this output, for example, a moving image with high resolution and a super-slow moving image with low resolution can be separately imaged.

Here, the configuration has been described in which the connection transistor 26 provided for each pixel unit 30 selectively connects the single pixel unit to the plurality of other pixel units in the unit group 40. However, a configuration can be used in which the single pixel unit is selectively connected to the other single pixel unit.

Figure 14A:
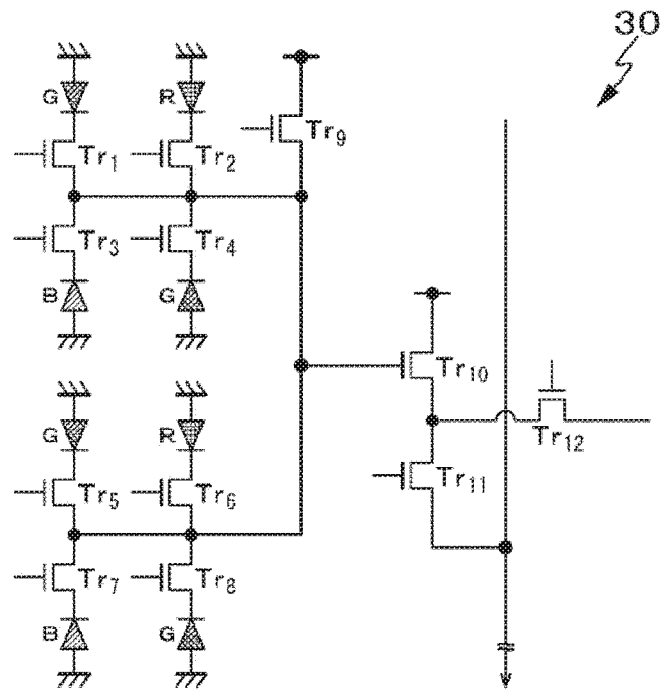
FIG. 14A is a circuit diagram illustrating a pixel circuit having two horizontal pixels×four vertical pixels as a single pixel unit.

Next, a layout of a transistor in a pixel circuit for realizing binning reading according to the first embodiment will be described. Here, for example, a pixel circuit corresponding to the single pixel unit 30 including two horizontal pixels× four vertical pixels will be described as an example. FIG. 14A illustrates a pixel circuit having a single pixel unit 30 including two horizontal pixels×four vertical pixels, and FIG. 14B illustrates a layout of a transistor.

In FIG. 14A, in a correspondence relationship with FIG. 10, for convenience, in the first pixel group on the upper side, a transfer transistor 22g of one pixel G is indicated as $Tr_1$, a transfer transistor 22r of a pixel R is indicated as $Tr_2$, a transfer transistor 22b of a pixel B is indicated as $Tr_3$, and a transfer transistor 22g of another pixel G is indicated as $Tr_4$. Furthermore, in the second pixel group on the lower side, a transfer transistor 22g of one pixel G is indicated as $Tr_5$, a transfer transistor 22r of a pixel R is indicated as $Tr_6$, a transfer transistor 22b of a pixel B is indicated as $Tr_7$, and a transfer transistor 22g of another pixel G is indicated as $Tr_8$. Moreover, a reset transistor 23 shared by the first pixel group and the second pixel group on the lower side is indicated as $Tr_9$, the amplification transistor 24 is indicated as $Tr_{10}$, the selection transistor 25 is indicated as $Tr_{11}$, and the connection transistor 26 is indicated as $Tr_{12}$.

Figure 14B:
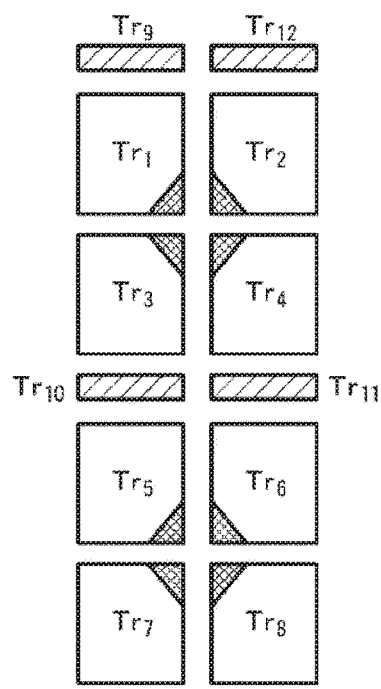
FIG. 14B is a layout diagram illustrating a layout of a transistor.

In the pixel circuit having the single pixel unit 30 including two horizontal pixels×four vertical pixels, as illustrated in FIG. 14B, a layout is made in which the four transistors $Tr_1$, $Tr_2$, $Tr_3$, and $Tr_4$ of the first pixel group are arranged in a square (square arrangement) and the four transistors $Tr_5$, $Tr_6$, $Tr_7$, and $Tr_8$ of the second pixel group are arranged in a square on the lower side of the four transistors of the first pixel group. Then, two transistors, for example, the transistors $Tr_{10}$ and $Tr_{11}$ from among the reset transistor $Tr_9$, the amplification transistor $Tr_{10}$, and the selection transistor $Tr_{11}$ are arranged between the first pixel group and the second pixel group respectively in correspondence with the transfer transistors $Tr_3$ and $Tr_4$ and the transfer transistors $Tr_5$ and $Tr_6$ arranged in squares. Furthermore, the remaining one transistor $Tr_9$ and the connection transistor $Tr_{12}$ are respectively arranged adjacent to the transfer transistors $Tr_1$ and $Tr_2$ of the first pixel group arranged in a square.

The layout of the transistors $Tr_1$ to $Tr_{11}$ described above is a layout in a case where the technology according to the present disclosure is not applied, that is, a case where the connection transistor 26 is not used. On the other hand, in a case where the technology according to the present disclosure is applied, that is, in a case where the connection transistor 26 is used, the transistor $Tr_{12}$ that is the connection transistor 26 is disposed in an empty space next to the transistor $Tr_9$.

In this way, in order to realize the technology according to the present disclosure, by using the layout using the empty space next to the transistor $Tr_9$ even when the connection transistor 26 is added for each pixel unit 30, it is not necessary to secure an arrangement space exclusively for the connection transistor 26. Therefore, the technology according to the present disclosure can be realized by adding the connection transistor 26 for each pixel unit 30 without increasing a layout area of the transistor.

Second Embodiment

A second embodiment is an example of cutout reading for reading a signal of a pixel in a specific region. As a method for reading the signal of the pixel in the specific region, two methods can be exemplified. In the second embodiment, a case will be described as an example in which an analog-digital converter (hereinafter, may be referred to as "AD converter") is disposed for each pixel column as one functional unit of a column processing unit 13. Then, in order to increase a reading speed when cutout reading is performed, it is important not to make a spare AD converter.

FIRST EXAMPLE

Figure 16A:
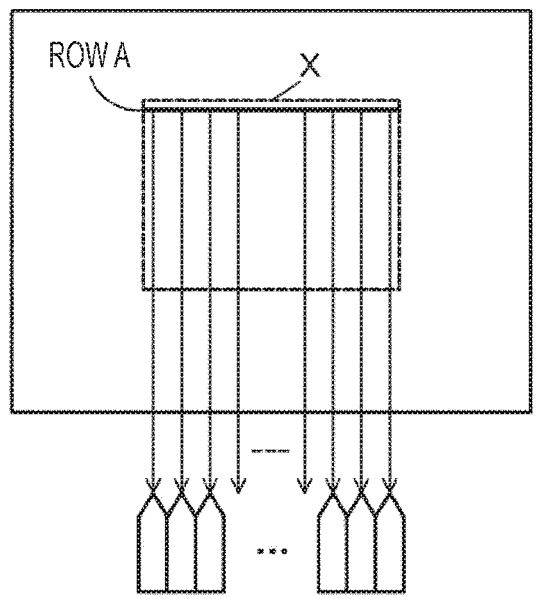
FIG. 16A is a diagram illustrating a signal reading route of a row A in the first example of the cutout reading operation.
Figure 16B:
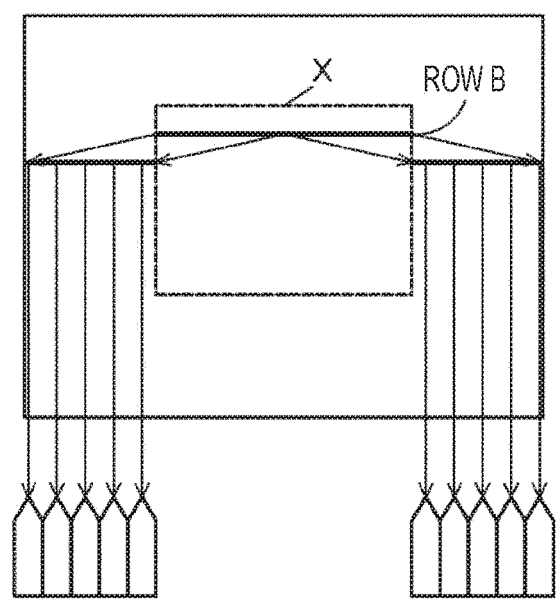
FIG. 16B is a diagram illustrating a signal reading route of a row B in the first example of the cutout reading operation.

FIG. 15 is an explanatory diagram of a first example of cutout reading according to a second embodiment. In the first example, when a specific region X of a pixel array unit 11 is assumed as a cutting region, when signals of respective pixels in the row A and the row B are concurrently read, for example, processing on the signal of each pixel in the row A is executed by an AD converter in a center part from among all the AD converters as many as the pixel columns as illustrated in FIG. 16A. Furthermore, as illustrated in FIG. 16B, processing on the signal of each pixel in the row B is executed by AD converters on both ends from among all the AD converters as many as the pixel columns. Subsequently, reading processing similar to the processing on the rows A and B is executed for every two rows.

Figure 17:
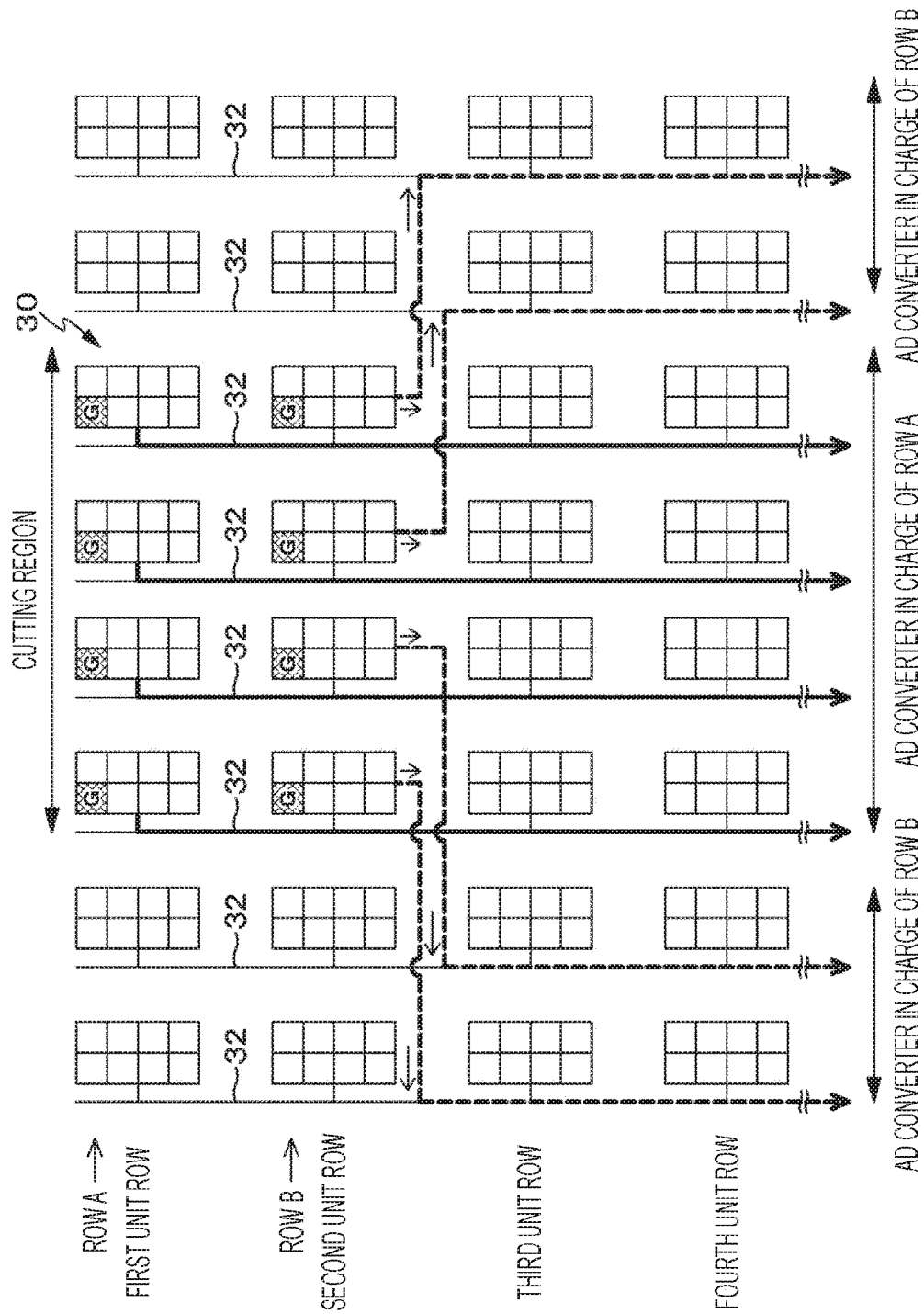
FIG. 17 is a diagram simply illustrating a state of the cutout reading operation according to the first example.

FIG. 17 simply illustrates a state of a cutout reading operation according to the first example. Here, for example, a case where a signal of a pixel G in each first row of the pixel units 30 in the cutting region X is read in a case where the single pixel unit 30 includes eight pixels including two horizontal pixels×four vertical pixels will be described as an example. In this case, a first row of the pixel units 30 in the first unit first pixel unit row, a first row of the pixel units 30 corresponding to the row A in FIG. 15 corresponds to the row A in FIG. 15, and a first row of the pixel units 30 in the second unit row corresponds to the row B in FIG. 15.

The connection transistor 26 is provided in the pixel unit (refer to FIG. 10). Then, by appropriately performing a conduction/non-conduction operation by the connection transistor 26 in unit of the pixel unit 30, it is possible to set a signal reading route in FIGS. 16A and 16B. That is, according to the action of the connection transistor 26 provided for each pixel unit 30, cutout reading for reading the signal of the pixel in the specific region can be realized.

In FIG. 17, the signal reading route of the row A is illustrated by a bold solid line, and the signal reading route of the row B is illustrated by a bold broken line. Furthermore, an arrow (→) indicates a flow of a signal. As is clear from FIG. 17, the signal of the pixel G in the row A is supplied to the AD converter through the vertical signal line 32 of the column of the pixel units 30 to which the pixel G belongs. Furthermore, the signal of the pixel G in a row G is supplied to an AD converter through the vertical signal line 32, which is not used for normal cutout reading, of the column of the pixel units 30 outside the cutting region X.

In a case where cutout reading is performed at a horizontal angle of view of ½ and a vertical angle of view of ½, a half of the AD converters becomes spare AD converters in normal cutout reading. By allocating a next unit row to the spare AD converter, cutout reading is performed by using all the AD converters. As a result, the speed is doubled, and the speed is further doubled by reducing the number of vertical rows by half. Therefore, the reading speed for $N^2$ can increased in cutout reading at a horizontal angle of view of 1/N and a vertical angle of view of 1/N.

SECOND EXAMPLE

Figure 18:
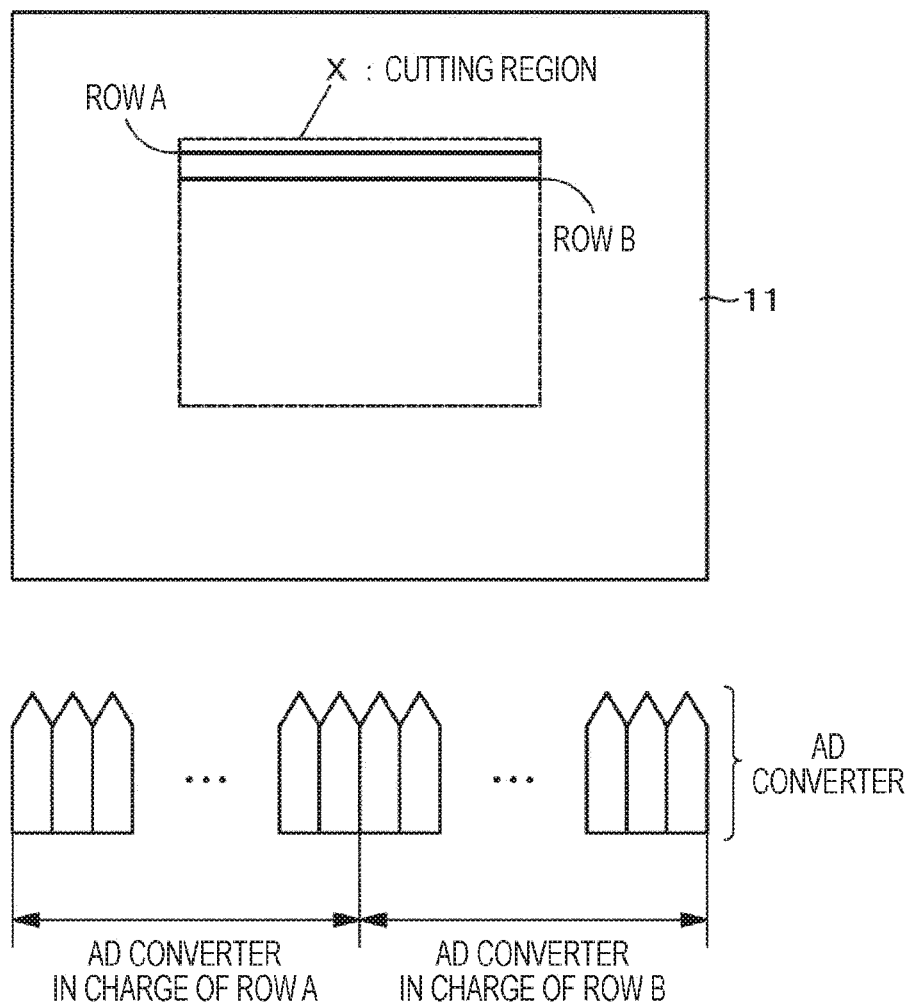
FIG. 18 is an explanatory diagram of a second example of cutout reading according to a second embodiment.
Figure 19A:
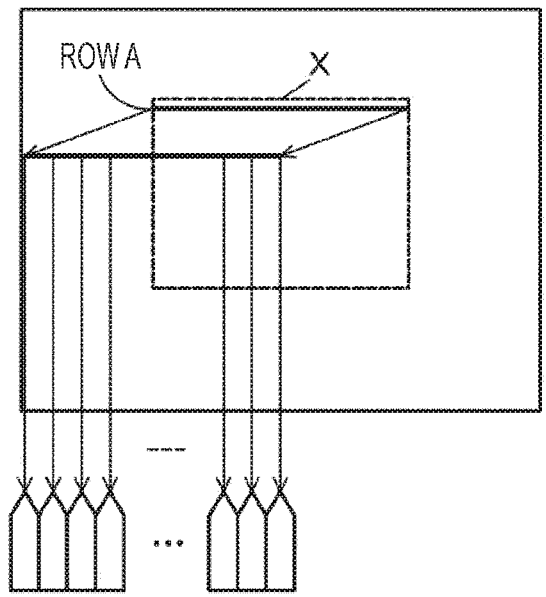
FIG. 19A is a diagram illustrating a signal reading route of a row A in the second example of the cutout reading operation.
Figure 19B:
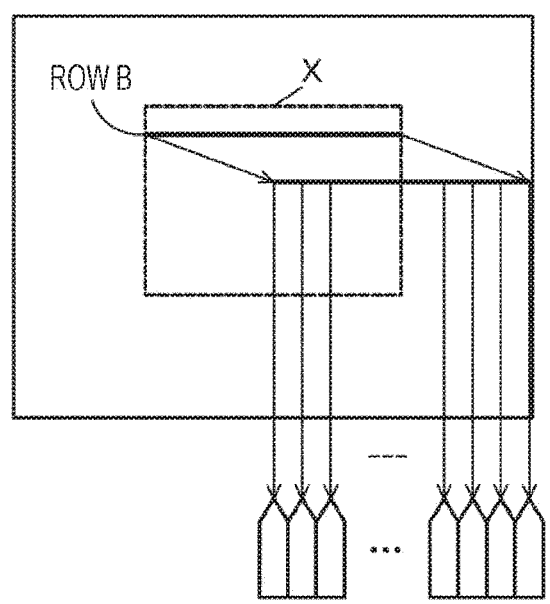
FIG. 19B is a diagram illustrating a signal reading route of a row B in the second example of the cutout reading operation.

FIG. 18 is an explanatory diagram of a second example of cutout reading according to a second embodiment. In the second example, when a specific region X of a pixel array unit 11 is assumed as a cutting region, when signals of respective pixels in the row A and the row B are concurrently read, for example, processing on the signal of each pixel in the row A is executed by a half of AD converters on one side (left side in this example) from among all the AD converters as many as the pixel columns as illustrated in FIG. 19A. Furthermore, the processing on the signal of each pixel in the row B is executed by another half of the AD converters on the other side (right side in this example) from among all the AD converters as many as the pixel columns as illustrated in FIG. 19B. Subsequently, reading processing similar to the processing on the rows A and B is executed for every two rows.

In a case of the second example, an action and an effect similar to those of the first example can be obtained. That is, by performing cutout reading by using all the AD converters, the reading speed can be increased than a case where there is a spare AD converter.

Third Embodiment

Figure 20:
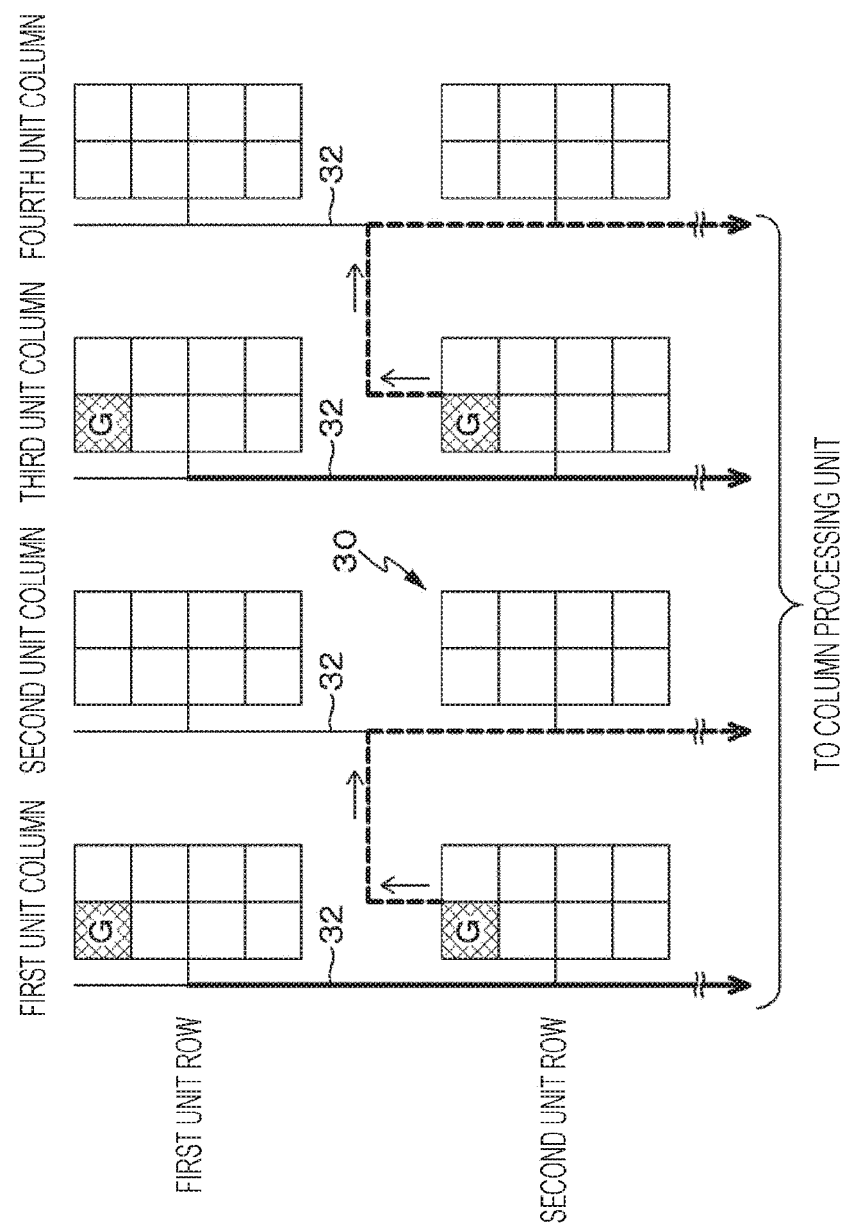
FIG. 20 is a diagram simply illustrating a state of a thinning reading operation according to a third example.

A third embodiment is an example of thinning reading for skipping a pixel row at a certain row cycle and reading a signal of a pixel in a predetermined pixel row. FIG. 20 simply illustrates a state of a thinning reading operation according to the third embodiment. Here, as an example, a case of thinning reading on four horizontal pixels×four vertical pixels is indicated in which a signal of a single pixel (for example, pixel G) within the four horizontal pixels is read and a signal of a single pixel (for example, pixel G) within the four vertical pixels is read. On thinning reading, a connection transistor 26 (refer to FIG. 10) provided for each pixel unit 30 effectively acts.

Then, in a case of this example, a signal of a pixel G in each first row of each pixel unit 30 in a first unit row and in a first unit column and a third unit column is supplied to a column processing unit 13 through each vertical signal line 32 of each of the first unit column and the third unit column. Furthermore, the signal of the pixel G in each first row of each pixel unit 30 in a second unit row and in the first unit column and the third unit column is supplied to the column processing unit 13 through each vertical signal line 32 in each of the second unit column and a fourth unit column in which the signals are not read.

In FIG. 20, a signal reading route of the pixel G in each first row of each of the pixel units 30 in the first unit row and in the first unit column and the third unit column is indicated by a bold solid line, and a signal reading route of the pixel G in each first row of each of the pixel units 30 in the first unit column and the third unit column and in the second unit row is indicated by a bold broken line. Furthermore, an arrow (→) indicates a flow of a signal.

In this way, according to the action of the connection transistor 26 provided for each pixel unit 30, it is possible to realize thinning reading for skipping a pixel row at a certain row cycle and reading the signal of the pixel in the predetermined pixel row. Then, as is clear from FIG. 20, in a case of thinning reading, reading can be performed by using all the AD converters according to the action of the connection transistor 26 provided for each pixel unit 30. Therefore, the reading speed can be increased than a case where there is a spare AD converter.

Modification of Embodiment

In the above embodiments, a case where the technology according to the present disclosure is applied to a CMOS image sensor has been described as an example. However, the present disclosure is not limited to the application to the CMOS image sensor. That is, the technology according to the present disclosure can be applied to general imaging devices including a plurality of pixel units including a first pixel unit (including a case of single pixel 2) and a second pixel unit and a vertical signal line.

Furthermore, in the embodiment, a case where the technology according to the present disclosure is applied to the imaging device having a configuration for reading the signals read from the pixel 2 to one side (lower side in example in FIG. 1) along the pixel column has been described as an example. However, the technology according to the present disclosure can be applied to an imaging device having a configuration for reading the signals read from the pixels 2 to both on the upper and lower sides along the pixel column.

Furthermore, the technology according to the present disclosure can be applied not only to the imaging device that detects an incident light amount distribution of visible light and captures the distribution as an image but also general imaging devices that captures an incident light amount distribution of infrared rays, X-rays, or particles as an image.

Application Example of Embodiment

Figure 21:
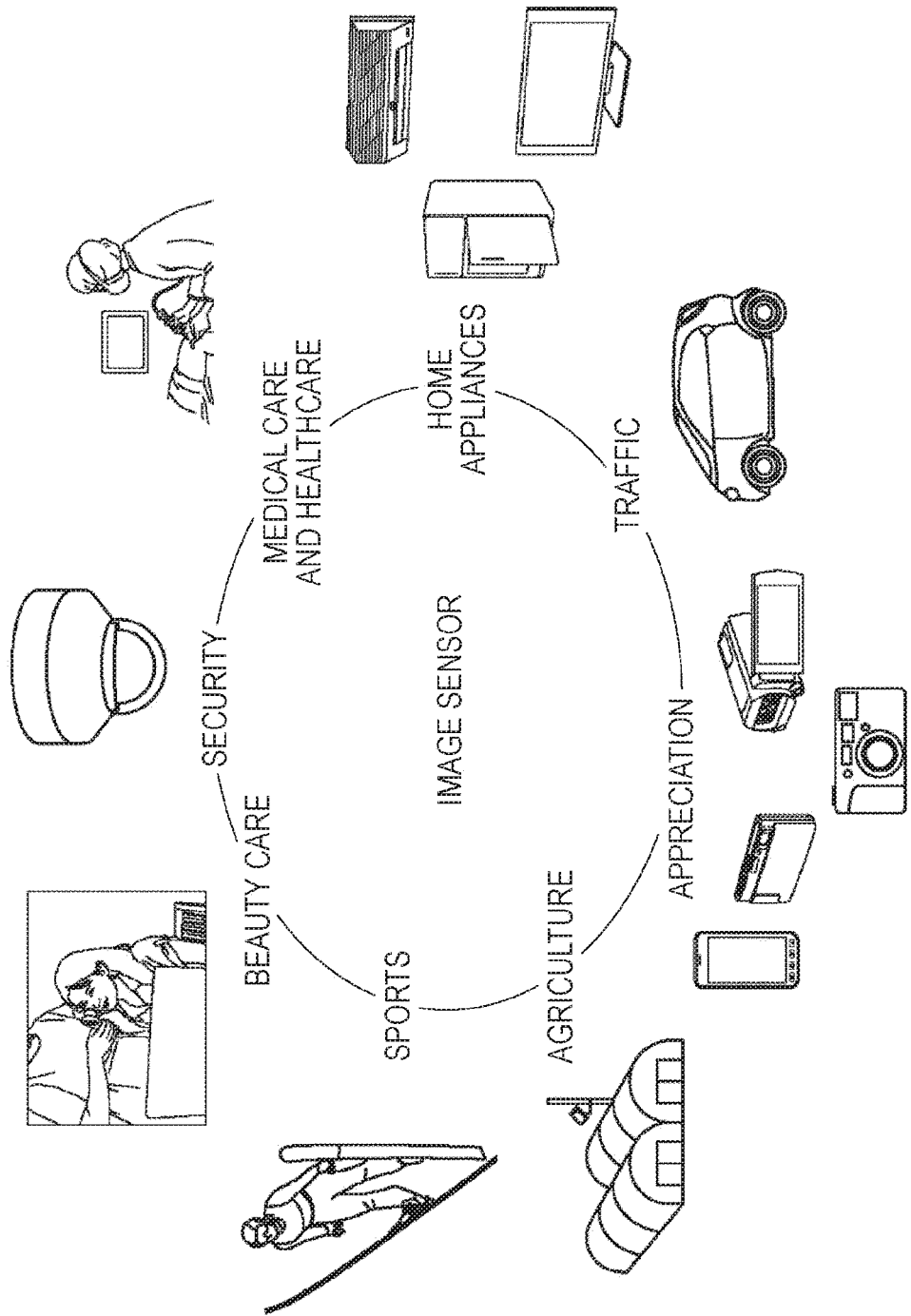
FIG. 21 is a diagram illustrating an application example of the technology according to the present disclosure.

For example, as illustrated in FIG. 21, an imaging device 1 according to the present embodiment described above can be applied to various devices that sense light such as visible light, infrared light, ultraviolet light, or X-rays. Specific examples of various devices are listed below.
- A device which images an image to be used for appreciation, such as a digital camera and a portable device with a camera function
- A device which is used in the field of traffic, such as an in-vehicle sensor for imaging the front, rear, surroundings, inside, and the like of a car for safe driving such as automatic stop, recognition of a driver's state, and the like, a monitoring camera for monitoring a traveling vehicle and a road, a distance measuring sensor for measuring a distance between vehicles, and the like
- A device which is used in the field of home appliances, such as a TV receiver, a refrigerator, or an air conditioner to image a gesture of a user and operate a device according to the gesture
- A device which is used in the field of medical care and healthcare, such as an endoscope or a device for performing angiography by receiving infrared light
- A device which is used in the field of security, such as a security monitoring camera or a camera for person authentication
- A device which is used in the field of beauty care, such as a skin measuring instrument for imaging skin or a microscope for imaging a scalp
- A device which is used in the field of sports, such as an action camera, a wearable camera for sports, or the like
- A device which is used in the field of agriculture, such as a camera for monitoring conditions of fields and crops <Electronic Apparatus According to Present Disclosure>

The technology according to the present disclosure can be applied to various products. Hereinafter, more specific application examples will be described. Here, a case where the technology according to the present disclosure is applied to electronic apparatuses such as an imaging device such as a digital still camera or a video camera, a mobile terminal device having an imaging function such as a mobile phone, and a copying machine using a camera module for an image reading unit will be described.

[Camera Module]

Figure 22:
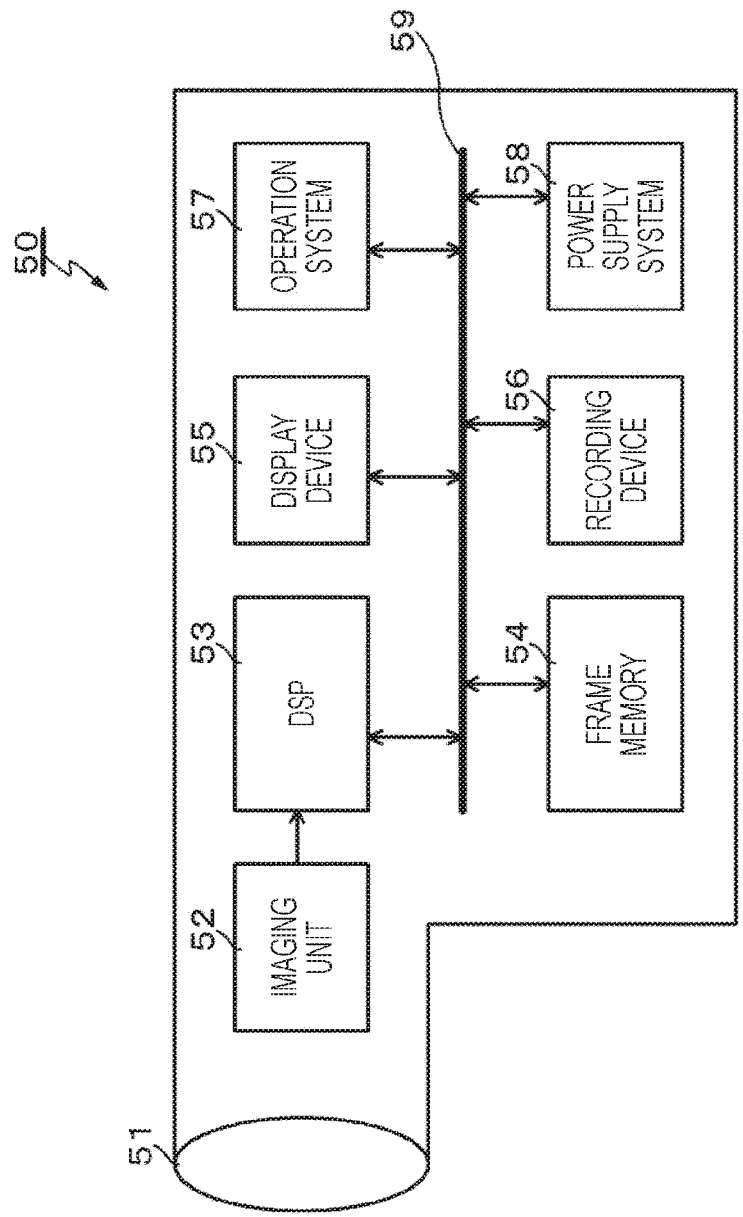
FIG. 22 is a block diagram illustrating an exemplary configuration of a camera module such as a digital still camera or a video camera which is an example of an electronic apparatus according to the present disclosure.

FIG. 22 is a block diagram illustrating an exemplary configuration of a camera module such as a digital still camera or a video camera which is an example of an electronic apparatus according to the present disclosure.

As illustrated in FIG. 22, a camera module 50 according to this example includes an imaging optical system 51 including a lens group or the like, an imaging unit 52, a DSP circuit 53, a frame memory 54, a display device 55, a recording device 56, an operation system 57, and a power supply system 58, or the like. Then, the DSP circuit 53, the frame memory 54, the display device 55, the recording device 56, the operation system 57, and the power supply system 58 are mutually connected via a bus line 59.

The imaging optical system 51 forms an image on an imaging surface of the imaging unit 52 by taking incident light (image light) from a subject. The imaging unit 52 converts an amount of the incident light focused on the imaging surface by the imaging optical system 51 in pixel units into an electric signal and outputs the signal as a pixel signal. The DSP circuit 53 executes general camera signal processing, for example, white balance processing, demosaic processing, gamma correction processing, or the like.

The frame memory 54 is appropriately used for storing data in the process of the signal processing by the DSP circuit 53. The display device 55 includes a panel-type display device such as a liquid crystal display device or an organic electro luminescence (EL) display device and displays a moving image or a still image imaged up by the imaging unit 52. The recording device 56 records the moving image or the still image imaged by the imaging unit 52 in a recording medium such as a portable semiconductor memory, an optical disk, or a hard disk drive (HDD).

The operation system 57 issues an instruction for operating various functions of the imaging device 50 on the basis of a user's operation. The power supply system 58 appropriately supplies various power to be operation power supplies of the DSP circuit 53, the frame memory 54, the display device 55, the recording device 56, and the operation system 57 to these devices.

Such a camera module 50 can be used as a camera module for a video camera and a digital still camera, and in addition, a mobile device such as a smartphone and a mobile phone. Then, in the camera module 50, by using the imaging device according to the embodiments described above, for example, an imaging device that employs binning reading according to the first embodiment as a pixel signal reading method as the imaging unit 52, a moving image with high resolution and a super-slow moving image with low resolution can be separately imaged.

<Configuration That Present Disclosure Can Have>

Note that the present disclosure can employ the following configuration.

«A. Imaging Device»

[A-1] An imaging device including:
a plurality of pixel units each including a first pixel unit and a second pixel unit; and
a vertical signal line, in which
each of the first pixel unit and the second pixel unit includes
an amplification transistor,
a selection transistor connected between the amplification transistor and the vertical signal line, and
a connection unit that selectively connects between a common connection node of the amplification transistor and the selection transistor of the first pixel unit and a common connection node of the amplification transistor and the selection transistor of the second pixel unit.

[A-2] The imaging device according to [A-1], in which
the connection unit selectively connects the single or the plurality of second pixel units to the first pixel unit in a unit group having the plurality of pixel units as a unit.

[A-3] The imaging device according to [A-2], in which
a signal of each pixel in the first pixel unit and the second pixel unit is output through the single vertical signal line belonging to a same unit group.

[A-4] The imaging device according to [A-3], in which
the pixel unit includes a first pixel group and a second pixel group and
includes a reset transistor, the amplification transistor, and the selection transistor shared by the first pixel group and the second pixel group,
the reset transistor resets a floating diffusion that converts a charge photoelectrically converted by each pixel in a same pixel unit into a pixel signal,
the amplification transistor reads the pixel signal converted by the floating diffusion, and
the selection transistor selectively outputs the pixel signal read by the amplification transistor to a single signal line belonging to a same unit group.

[A-5] The imaging device according to [A-4], in which
the connection unit is provided for each pixel unit and includes a connection transistor of which one end is connected to the common connection node of the amplification transistor and the selection transistor.

[A-6] The imaging device according to [A-5], in which
each of the first pixel group and the second pixel group includes four pixels arranged in two rows and two columns, and transfer transistors of the respective four pixels in each of the first pixel group and the second pixel group are arranged in a square,
two transistors among the reset transistor, the amplification transistor, and the selection transistor are arranged between the first pixel group and the second pixel group in correspondence with the transfer transistors arranged in a square, and
the remaining single transistor and the connection transistor are arranged adjacent to the transfer transistors arranged in a square of the first pixel group.

[A-7] The imaging device according to any one of [A-1] to [A-5], in which
the connection unit realizes binning reading for reading a signal of a pixel as assuming a plurality of pixels as a single pixel.

[A-8] The imaging device according to any one of [A-1] to [A-5], in which
the connection unit realizes cutout reading for reading a signal of a pixel in a specific region.

[A-9] The imaging device according to any one of [A-1] to [A-5], in which
the connection unit realizes thinning reading for reading a signal of a pixel in a predetermined pixel row.

«B. Electronic Apparatus»

[B-1] An electronic apparatus including:
an imaging device that includes
a plurality of pixel units each including a first pixel unit and a second pixel unit, and
a vertical signal line, in which
each of the first pixel unit and the second pixel unit includes
an amplification transistor,
a selection transistor connected between the amplification transistor and the vertical signal line, and
a connection unit that selectively connects between a common connection node of the amplification transistor and the selection transistor of the first pixel unit and a common connection node of the amplification transistor and the selection transistor of the second pixel unit.

[B-2] The electronic apparatus according to [B-1], in which
the connection unit selectively connects the single or the plurality of second pixel units to the first pixel unit in a unit group having the plurality of pixel units as a unit.

[B-3] The electronic apparatus according to [B-2], in which
a signal of each pixel in the first pixel unit and the second pixel unit is output through the single vertical signal line belonging to a same unit group.

[B-4] The electronic apparatus according to [B-3], in which
the pixel unit includes a first pixel group and a second pixel group and
includes a reset transistor, the amplification transistor, and the selection transistor shared by the first pixel group and the second pixel group,
the reset transistor resets a floating diffusion that converts a charge photoelectrically converted by each pixel in a same pixel unit into a pixel signal,
the amplification transistor reads the pixel signal converted by the floating diffusion, and
the selection transistor selectively outputs the pixel signal read by the amplification transistor to a single signal line belonging to a same unit group.

[B-5] The electronic apparatus according to [B-4], in which
the connection unit is provided for each pixel unit and includes a connection transistor of which one end is connected to the common connection node of the amplification transistor and the selection transistor.

[B-6] The electronic apparatus according to [B-5], in which
each of the first pixel group and the second pixel group includes four pixels arranged in two rows and two columns, and transfer transistors of the respective four pixels in each of the first pixel group and the second pixel group are arranged in a square,
two transistors among the reset transistor, the amplification transistor, and the selection transistor are arranged between the first pixel group and the second pixel group in correspondence with the transfer transistors arranged in a square, and
the remaining single transistor and the connection transistor are arranged adjacent to the transfer transistors arranged in a square of the first pixel group.

[B-7] The electronic apparatus according to any one of [B-1] to [B-5], in which
the connection unit realizes binning reading for reading a signal of a pixel as assuming a plurality of pixels as a single pixel.

[B-8] The electronic apparatus according to any one of [B-1] to [B-5], in which
the connection unit realizes cutout reading for reading a signal of a pixel in a specific region.

[B-9] The electronic apparatus according to any one of [B-1] to [B-5], in which
the connection unit realizes thinning reading for reading a signal of a pixel in a predetermined pixel row.

REFERENCE SIGNS LIST

1 Imaging device
2 Pixel
10 Semiconductor substrate
11 Pixel array unit
12 Row selection unit 13 Column processing unit
14 Column scanning unit
15 Timing control unit
21 Photodiode
22 Transfer transistor
23 Reset transistor
24 Amplification transistor
25 Selection transistor
26 Connection transistor
30 Pixel unit
31 ($31_1$ to $31_m$) Pixel driving line
32 ($32_1$ to $32_n$, $32_a$, $32_b$) Vertical signal line
40 Unit group
50 Camera module
51 Imaging optical system
52 Imaging unit

The invention claimed is:

1. An imaging device, comprising:
a plurality of pixel units, wherein
each of the plurality of pixel units includes a first pixel unit and a second pixel unit,
each of the first pixel unit and the second pixel unit includes a first pixel group and a second pixel group, and
each of the first pixel group and the second pixel group includes a plurality of pixels; and
a vertical signal line, wherein each of the first pixel unit and the second pixel unit includes:
a plurality of transfer transistors, wherein
each of the plurality of transfer transistors is in a corresponding pixel of the plurality of pixels, and
the plurality of transfer transistors is in a square arrangement in each of the first pixel group and the second pixel group;
an amplification transistor;
a selection transistor connected between the amplification transistor and the vertical signal line; and
a connection transistor configured to selectively connect between a common connection node of the amplification transistor and the selection transistor of the first pixel unit and a common connection node of the amplification transistor and the selection transistor of the second pixel unit, wherein the connection transistor is adjacent to the square arrangement of the plurality of transfer transistors corresponding to the first pixel group.

2. The imaging device according to claim 1, wherein
the connection transistor is further configured to selectively connect the second pixel unit to the first pixel unit,
the second pixel unit comprises a single pixel unit or a plurality of second pixel units,
each of the first pixel unit and the second pixel unit corresponds to a unit group, and
each of the plurality of pixel units corresponds to a unit of the unit group.

3. The imaging device according to claim 2, wherein
a signal of each pixel in the first pixel unit and the second pixel unit is output through the vertical signal line that is associated with the unit group, and
the vertical signal line associated with the unit group is a single vertical signal line.

4. The imaging device according to claim 3, wherein
each of the first pixel unit and the second pixel unit further includes a reset transistor,
each of the reset transistor, the amplification transistor, and the selection transistor is shared by the first pixel group and the second pixel group,
the reset transistor is configured to reset a floating diffusion that converts a charge photoelectrically converted by each pixel in a corresponding pixel unit into a pixel signal,
the amplification transistor is configured to read the pixel signal converted by the floating diffusion, and
the selection transistor is configured to selectively output the pixel signal read by the amplification transistor to the single vertical signal line associated with the unit group.

5. The imaging device according to claim 4, wherein one end of the connection transistor is connected to the common connection node of the amplification transistor and the selection transistor in each pixel unit of the plurality of pixel units.

6. The imaging device according to claim 5, wherein
each of the first pixel group and the second pixel group includes four pixels that are in two rows and two columns,
the plurality of transfer transistors corresponding to the four pixels in each of the first pixel group and the second pixel group is in the square arrangement,
two transistors among the reset transistor, the amplification transistor, and the selection transistor are between the first pixel group and the second pixel group in correspondence with the plurality of transfer transistors in the square arrangement,
a third transistor among the reset transistor, the amplification transistor, and the selection transistor adjacent to the square arrangement of the plurality of transfer transistors corresponding to the first pixel group,
the third transistor is other than the two transistors, and
the third transistor is next to the connection transistor.

7. The imaging device according to claim 1, wherein
the connection transistor is further configured to realize binning reading, and
a signal of a pixel is read based on an assumption that the plurality of pixels is a single pixel.

8. The imaging device according to claim 1, wherein the connection transistor is further configured to realize cutout reading to read a signal of a pixel in a specific region.

9. The imaging device according to claim 1, wherein the connection transistor is further configured to realize thinning reading to read a signal of a pixel in a specific pixel row.

10. An electronic apparatus, comprising:
an imaging device that includes:
a plurality of pixel units, wherein
each of the plurality of pixel units includes a first pixel unit and a second pixel unit,
each of the first pixel unit and the second pixel unit includes a first pixel group and a second pixel group, and
each of the first pixel group and the second pixel group includes a plurality of pixels; and
a vertical signal line, wherein each of the first pixel unit and the second pixel unit includes:
a plurality of transfer transistors, wherein
each of the plurality of transfer transistors is in a corresponding pixel of the plurality of pixels, and
the plurality of transfer transistors is in a square arrangement in each of the first pixel group and the second pixel group;
an amplification transistor;

a selection transistor connected between the amplification transistor and the vertical signal line; and a connection transistor configured to selectively connect between a common connection node of the amplification transistor and the selection transistor of the first pixel unit and a common connection node of the amplification transistor and the selection transistor of the second pixel unit, wherein the connection transistor is adjacent to the square arrangement of the plurality of transfer transistors corresponding to the first pixel group.

* * * * *